United States Patent
Woo et al.

(10) Patent No.: US 9,990,248 B2
(45) Date of Patent: Jun. 5, 2018

(54) DISPLAY DRIVER INTEGRATED CIRCUIT AND DISPLAY DEVICE HAVING THE SAME

(71) Applicants: Sooyoung Woo, Hwanseong-si (KR); Yanghyo Kim, Suwon-si (KR); Dokyung Kim, Yongin-si (KR); Junho Park, Yongin-si (KR)

(72) Inventors: Sooyoung Woo, Hwanseong-si (KR); Yanghyo Kim, Suwon-si (KR); Dokyung Kim, Yongin-si (KR); Junho Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 194 days.

(21) Appl. No.: 14/680,605

(22) Filed: Apr. 7, 2015

(65) Prior Publication Data
US 2016/0299188 A1   Oct. 13, 2016

(51) Int. Cl.
*G06F 11/00* (2006.01)
*G06F 11/10* (2006.01)
*G01R 31/317* (2006.01)

(52) U.S. Cl.
CPC .... *G06F 11/1004* (2013.01); *G01R 31/31703* (2013.01)

(58) Field of Classification Search
USPC .......................................................... 714/30
See application file for complete search history.

(56) References Cited

U.S. PATENT DOCUMENTS

| 7,567,092 B2 | 7/2009 | Park et al. |
| 2008/0072107 A1* | 3/2008 | Jung ................... G06F 11/0742 714/57 |
| 2008/0201623 A1* | 8/2008 | Reggiori ............ G11C 29/1201 714/719 |

(Continued)

FOREIGN PATENT DOCUMENTS

| JP | 2004032466 A | 1/2004 |
| JP | 2010060711 A | 3/2010 |

(Continued)

OTHER PUBLICATIONS

"VESA Display Stream Compression (DS) Conformance Test Guideline (CTG)" Qualcomm Technologies Inc. (2014).

*Primary Examiner* — Sarai E Butler
(74) *Attorney, Agent, or Firm* — Harness, Dickey & Pierce, P.L.C.

(57) ABSTRACT

A display driver integrated circuit including a logic circuit configured to receive image data from a host and an image cyclic redundancy check (CRC) unit configured to perform a CRC operation on output data of the logic circuit and transmit the performed result to the host may be provided. Additionally, a timing controller including a logic circuit configured to receive image data from a host and an image CRC unit configured to perform a CRC operation on output data associated with the logic circuit and configured to transmit the performed result to the host may also be provided. Further, a display device including a display panel, a display driver integrated circuit configured to drive the display panel and an image CRC unit configured to perform a CRC operation on output data of the logic circuit and transmit the performed result may be provided.

20 Claims, 29 Drawing Sheets

(56) References Cited

U.S. PATENT DOCUMENTS

| | | | |
|---|---|---|---|
| 2011/0032829 A1* | 2/2011 | Rivoir | G01R 31/2834 370/242 |
| 2013/0254593 A1* | 9/2013 | Miyano | G06F 11/2733 714/27 |
| 2013/0346695 A1* | 12/2013 | Loh | G06F 12/0895 711/122 |
| 2015/0302822 A1* | 10/2015 | Lee | G09G 3/2096 345/204 |

FOREIGN PATENT DOCUMENTS

| | | |
|---|---|---|
| KR | 1020080015276 A | 2/2008 |
| KR | 100896178 B1 | 5/2009 |

* cited by examiner

1×1 Check Pattern

2×2 Check Pattern

4×4 Check Pattern

8×8 Check Pattern

Column Rainbow

Page Rainbow

20% Black, 80% White

1line × 1line

Crosstalk B

Crosstalk C

Flicker Pattern

DISPLAY DRIVER INTEGRATED CIRCUIT AND DISPLAY DEVICE HAVING THE SAME

BACKGROUND

1. Field

Some example embodiments of the inventive concepts relate to a display driver integrated circuit (DDI), and more particularly, to DDIs capable of testing an internal logic circuit, or analyzing a failure in the DDI, by itself, and display devices capable of the same functionality.

2. Description of Related Art

Generally, the development process of a display driver integrated circuit (DDI) may include an integrated circuit (IC) design stage, a fabrication stage, an electrical die sorting (EDS) test stage, and an IC sampling stage. Each of these development stages may introduce errors to the proper functioning of the DDI that may be costly to identify, debug and correct. Further, the DDI typically has more input/output pins than other types of ICs, but the DDI itself may have a small number of pads when the pads for a display operation are excluded, which further inhibits the ability of engineers to diagnose and correct problems with the DDI.

When a functional or operational problem in the data path of a DDI occurs, it is difficult to determine the state of the internal signals through the pads for a diagnostic test purposes.

Moreover, the data input pads for driving a fundamental display have limited input/output performance and are incapable of driving the display at a high refresh rate. For example, it is difficult to test a DDI that supports a full high-density (FHD) display resolution in real-time.

SUMMARY

Some example embodiments of the inventive concepts provide a display driver integrated circuit (DDI) capable of testing a logic circuit internal to the DDI itself and capable of analyzing a failure in the DDI by itself.

Other embodiments of the inventive concepts provide a timing controller capable of testing a logic circuit in the timing controller or analyzing a failure in the timing controller by itself.

Other embodiments of the inventive concepts provide a mobile device that includes a DDI embodying one aspect of the inventive concepts.

The technical objectives of the inventive concepts are not limited to the above disclosure, other objectives may become apparent to those of ordinary skill in the art based on the following descriptions.

In accordance with one aspect of the inventive concepts, a display driver integrated circuit (DDI) may include a logic circuit configured to receive image data from a host, and may also include an image cyclic redundancy check (CRC) unit configured to perform a CRC operation on output data associated with the logic circuit and configured to transmit the performed result to the host.

In an example embodiment, the DDI may further include a reference pattern generator configured to generate reference pattern data and expected output data for verifying the logic circuit, and may be configured to transmit the reference pattern data to the logic circuit and wherein the image CRC unit may be configured to compare the expected output data with output data associated with the logic circuit.

In another example embodiment, the DDI may further include a selection circuit configured to transmit at least one of the image data and the reference pattern data to the logic circuit, wherein the selection circuit may be configured to transmit the image data to the logic circuit in a normal mode and the selection circuit may configure to transmit the reference pattern data to the logic circuit in a test mode.

In still another example embodiment, the reference pattern generator may be configured to generate at least one of an all-black pattern, an all-white pattern, a 1×1 check pattern, a 2×2 check pattern, a 4×4 check pattern, a 8×8 check pattern, a column rainbow pattern, a page rainbow pattern, a 0~255 gray page pattern, a 0~239 grey column pattern, a 20% black & 80% white pattern, a 1(line)×1(line) pattern, a 2(line)×2(line) pattern, a crosstalk A pattern, a crosstalk B pattern, a crosstalk C pattern, or a flicker pattern.

In yet another example embodiment, the logic circuit may be configured to include a plurality of intellectual property blocks (IPs), or intellectual property cores, and the image CRC unit may be configured to transmit to the host a log file based on information associated with at least one failed IP from the plurality of IPs.

In yet another example embodiment, the DDI may further include a memory device configured to store the image data, wherein the memory device may include a graphic random access memory.

In yet another example embodiment, the logic circuit may include a decoder for decoding the image data, and the decoder may be configured to receive at least one of the image data or the reference pattern data and the image CRC unit may be configured to compare the expected output data with output associated with the decoder.

In yet another example embodiment, the host may be configured to transmit the encoded image data to the logic circuit and the decoder may be configured to decode the encoded image data and may transmit the decoded image data to a source driver.

In accordance with another aspect of the inventive concepts, a timing controller may include a logic circuit configured to receive image data from a host; and an image cyclic redundancy check (CRC) unit configured to perform a CRC operation on output data associated with the logic circuit and configured to transmit the performed result to the host.

In an example embodiment, the DDI may further include a reference pattern generator configured to generate reference pattern data and expected output data for the verification of the logic circuit, wherein the reference pattern generator may be configured to transmit the reference pattern data to the logic circuit and the image CRC unit may be configured to compare the expected output data with output data associated with the logic circuit.

In another example embodiment, the DDI may further include a selection circuit configured to transmit at least one of the image data and the reference pattern data to the logic circuit, wherein the selection circuit may be configured to transmit the image data to the logic circuit in a normal mode and the selection circuit may be configured to transmit the reference pattern data to the logic circuit in a test mode.

In still another example embodiment, the reference pattern generator may be configured to generate at least one of an all-black pattern, an all-white pattern, a 1×1 check pattern, a 2×2 check pattern, a 4×4 check pattern, a 8×8 check pattern, a column rainbow pattern, a page rainbow pattern, a 0~255 gray page pattern, a 0~239 grey column pattern, a 20% black & 80% white pattern, a 1(line)×1(line) pattern, a 2(line)×2(line) pattern, a crosstalk A pattern, a crosstalk B pattern, a crosstalk C pattern, or a flicker pattern.

In yet another example embodiment, the logic circuit may be configured to include a plurality of intellectual property blocks (IPs) and the image CRC unit maybe configured to transmit a log file to the host based on information associated with at least one a failed IP from the plurality of IPs.

In yet another example embodiment, the DDI may further include a memory device configured to store the image data, wherein the memory device may include a graphic random access memory.

In yet another example embodiment, the logic circuit may include a decoder for decoding the image data, and the decoder may be configured to receive at least one of one of the image data and the reference pattern data and the image CRC unit may be configured to compare the expected output data with output from the decoder.

In accordance with still another aspect of the inventive concepts, a display device may include a display panel; and a DDI configured to drive the display panel, wherein the DDI may include a logic circuit configured to receive image data from a host; and an image cyclic redundancy check (CRC) unit configured to perform a CRC operation on output data of the logic circuit and transmit the performed result to the host.

In an example embodiment, the DDI may further include a reference pattern generator configured to generate reference pattern data and expected output data for verification of the logic circuit, wherein the reference pattern generator may be configured transmit the reference pattern data to the logic circuit and the image CRC unit may be configured to compare the expected output data with output data associated with the logic circuit.

In another example embodiment, the DDI may further include a selection circuit configured to transmit at least one of the image data and the reference pattern data to the logic circuit, wherein the selection circuit may be configured to transmit the image data to the logic circuit in a normal mode and the selection circuit may be configured to transmit the reference pattern data to the logic circuit in a test mode.

In still another example embodiment, the reference pattern generator may be configured to generate at least one of an all-black pattern, an all-white pattern, a 1×1 check pattern, a 2×2 check pattern, a 4×4 check pattern, a 8×8 check pattern, a column rainbow pattern, a page rainbow pattern, a 0~255 gray page pattern, a 0~239 grey column pattern, a 20% black & 80% white pattern, a 1(line)×1(line) pattern, a 2(line)×2(line) pattern, a crosstalk A pattern, a crosstalk B pattern, a crosstalk C pattern, or a flicker pattern.

In yet another example embodiment, the logic circuit may be configured to include a plurality of intellectual property blocks (IPs) and the image CRC unit may be configured to transmit a log file to the host based on information associated with at least one failed IP of the plurality from IPs.

In accordance with another aspect of the inventive concepts, a system for testing internal logic circuits within a semiconductor device may include a host configured to transmit source data to be sent to an output device, an internal logic circuit configured to process the transmitted source data, the logic circuit including, at least one intellectual property block configured to process the transmitted source data, and a data error check unit configured to perform a data error check operation corresponding to reference data and the processed data.

In an example embodiment, the logic circuit may further include a test pattern generator configured to generate a test data and a selection unit configured to transmit the reference data to the data error check unit, wherein the reference data may be associated with the test data or the transmitted source data. The data error check unit may be configured to output results of the data error check operation to the host, and the host may be configured to verify the operation of the internal logic circuit.

In another example embodiment, the internal logic circuit may be associated with a timing controller.

In yet another example embodiment, a display panel may be configured to receive and display the processed data from the internal logic circuit, and the internal logic circuit may be associated with a display driver integrated circuit.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EXAMPLE EMBODIMENTS

Figure 1:
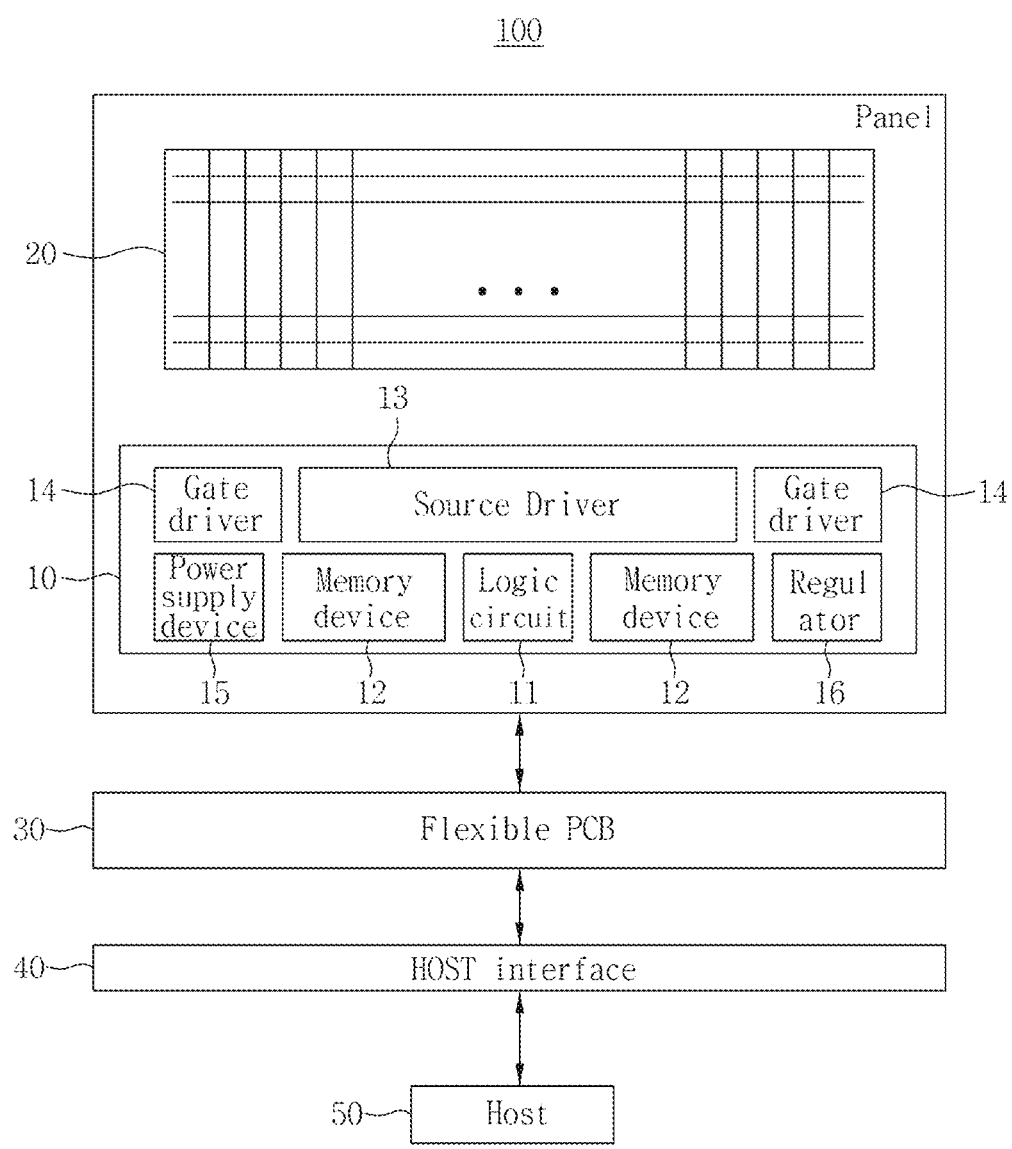
FIG. 1 is a block diagram illustrating a display device 100 according to an example embodiment of the inventive concepts.

Example embodiments of the present invention are described below in sufficient detail to enable those of ordinary skill in the art to embody and practice the present invention. It is important to understand that the present invention may be embodied in many alternate forms and should not be construed as limited to the example embodiments set forth herein.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in singular may number one or more, unless the context clearly indicates otherwise. It will be further understood that the terms "comprises," "comprising," "includes," and/or "including," when used herein, specify the presence of stated features, items, stages, operations, elements, and/or components, but do not preclude the presence or addition of one or more other features, items, stages, operations, elements, components, and/or groups thereof.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Meanwhile, when it is possible to implement any embodiment in any other way, a function or an operation specified in a specific block may be performed differently from a flow specified in a flowchart. For example, consecutive two blocks may actually perform the function or the operation simultaneously, and the two blocks may perform the function or the operation conversely according to a related operation or function.

Embodiments of the present inventive concepts will be described below with reference to the attached drawings.

FIG. 1 is a block diagram illustrating a display device 100 according to an example embodiment of the inventive concepts.

Referring to FIG. 1, the display device 100 according to an example embodiment of the inventive concepts includes a display driver integrated circuit (DDI) 10 and a display panel 20.

The DDI 10 may receive data transmitted from a host 50 through a host interface 30. As one of ordinary skill in the art will appreciate, the data transmitted by the host may be any form of data, including for example, image data. While the example embodiments are drawn to the use of image data for the sake of clarity and brevity, one of ordinary skill in the art would see that the inventive concepts presented herein may be applicable to any other form of data as well. The DDI 10 may control the display panel 20 to display a 2-dimensional or 3-dimensional image corresponding to the image data on the display panel 20.

Moreover, the DDI 10 may communicate with the host 50 through the host interface 30. In some example embodiments, the host 50 may include an application processor.

The display panel 20 may display the 2-dimensional or 3-dimensional image corresponding to the image data. In some example embodiment, the display panel 20 may include, for example, at least one of a thin film transistor-liquid crystal display (TFT-LCD), an organic light emitting diode (OLED), a field emission display, or a plasma display panel (PDP).

The DDI 10 may include a logic circuit 11, a memory device 12, a source driver 13, a gate driver 14, a power supply device 15, and a regulator 16.

The logic circuit 11 may include an image processor, a memory controller for controlling the memory device 12, and a plurality of intellectual property blocks (IPs). The logic circuit 11 according to an example embodiment of the inventive concepts will be described with reference to FIGS. 3A to 4B in detail.

The image data may be stored in the memory device 12. Moreover, the image data may be transmitted to the source driver 13 and the gate driver 14. Moreover, the display panel 20 may display an image corresponding to the image data.

The source driver 13 may apply voltage to pixels. That is, the gate driver 14 applies a pulse to a gate of the display panel 20 and turns on each of the pixels as an activated state. Accordingly, the source driver 13 may apply the voltage to the pixels on the display panel 20 through a data line.

The source driver 13 may transform the image data into a grey voltage corresponding to a digital image signal. The source driver 13 may apply the transformed grey voltage to each pixel electrode. That is, the source driver 13 may transform digital image data into each pixel voltage and apply the transformed pixel voltage to the data line.

The gate driver 14 may generate voltage to be applied to a gate electrode corresponding to each pixel in the display panel 20 and apply the generated voltage to a gate line. The gate driver 14 may apply a voltage by sequentially selecting the gate line.

The memory device 12 may store image data to be inputted to the source driver 13. In some example embodiments, the memory device 12 may be implemented with a graphic random access memory (GRAM). A memory capacity of the memory device 12 may be determined according to a resolution of a display device and the number of colors to be expressed in units of pixels.

The logic circuit 11 may access the memory device 12. The image data stored in the memory device 12 may be transmitted to the host 50 through the host interface 40. The DDI 10 may communicate with the host 50 through the host interface 40.

The DDI 10 and the display panel 20 are installed on a flexible printed circuit board (FPCB) 30.

In a DDI according to a related art, internal signals may be monitored through the output pins of a backlight control (BC), a serial data output (SDO), a display tearing effect monitor (TE), and an internal oscillator clock (OSC). Thus, DDIs according to the related art are limited to monitoring a small number of signals in real-time because the DDI may only monitor the internal signals through four output pins.

Additionally, even though the number of output pads for monitoring the internal signal may increase, the signals of a data path operated at frequencies of more than 100 MHz in the DDI may not be monitored in real time.

Moreover, even if a person were to use an analysis device such as a logic analyzer, there is a limitation on the verification and failure analysis with respect to an operation because of the limitation on the number of output pins for monitoring internal signals.

The DDI according to the related art may also have a register read function. However, the register read may only be performed at a low speed through a serial interface.

Further, because the register read data is outputted to a horizontal unit during a vertical porch period in a display operation, the real-time monitoring capability is limited. Moreover, when performing a failure analysis process during the mass-production of DDIs using the related art techniques discussed above, it is difficult to determine whether a problem found with the DDI is due to a problem within an inside logic circuit of the DDI, or a gamma and source block in the DDI.

According to an example embodiment of the inventive concepts, a test engineer may identify an internal state of the DDI 10 in real-time without an expensive analysis device during testing, verification, or failure analysis in the DDI 10.

In each development stage of IC manufacturing, for example, the chip on film (COF) stage, the display module manufacturing stage, and/or the mobile set manufacturing stage, etc., the DDI 10 according to an example embodiment of the inventive concepts may determine the internal state of each stage of a display data path.

Moreover, the DDI 10 according to an example embodiment of the inventive concepts may include an image pattern generator. The image pattern generator may generate an image pattern and an expected output value. The DDI 10 may input the image pattern to an internal logic circuit. The DDI 10 may compare the expected output value with the output of the internal logic circuit.

Accordingly, the DDI 10 may verify the internal logic circuit. That is, the DDI 10 may include a built-in self-test (BIST) for verifying the internal logic circuit.

Figure 2A:
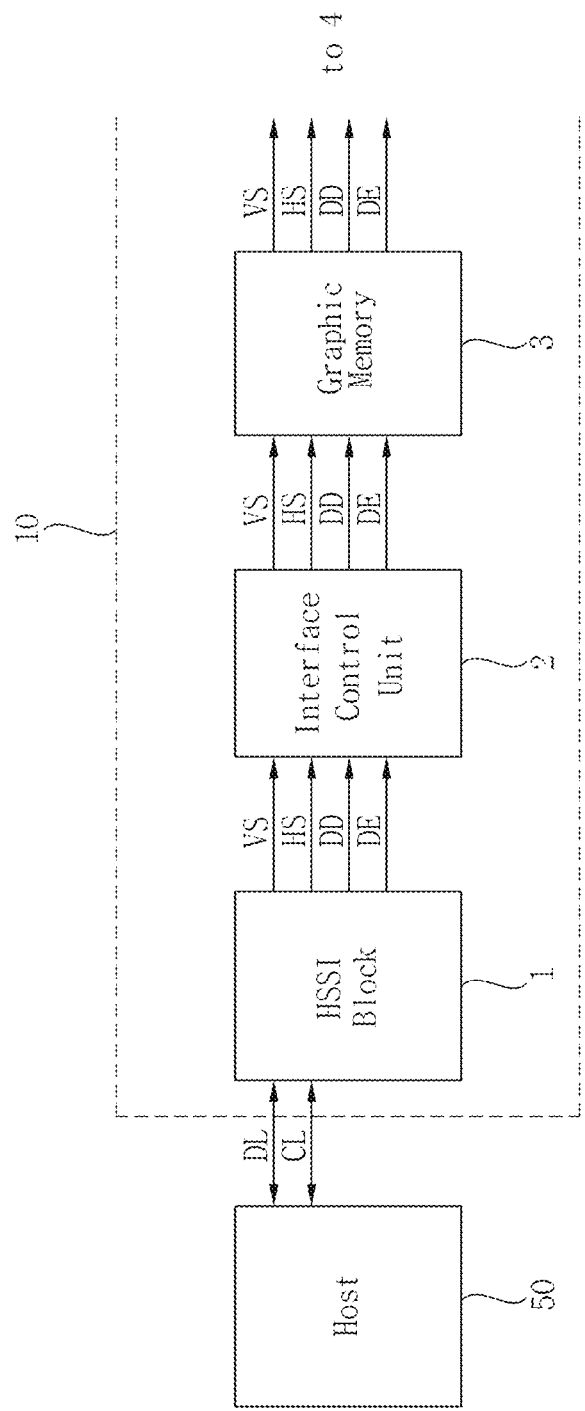
FIGS. 2A and 2B are block diagrams illustrating a display driver integrated circuit (DDI) according to the related art.
Figure 2B:
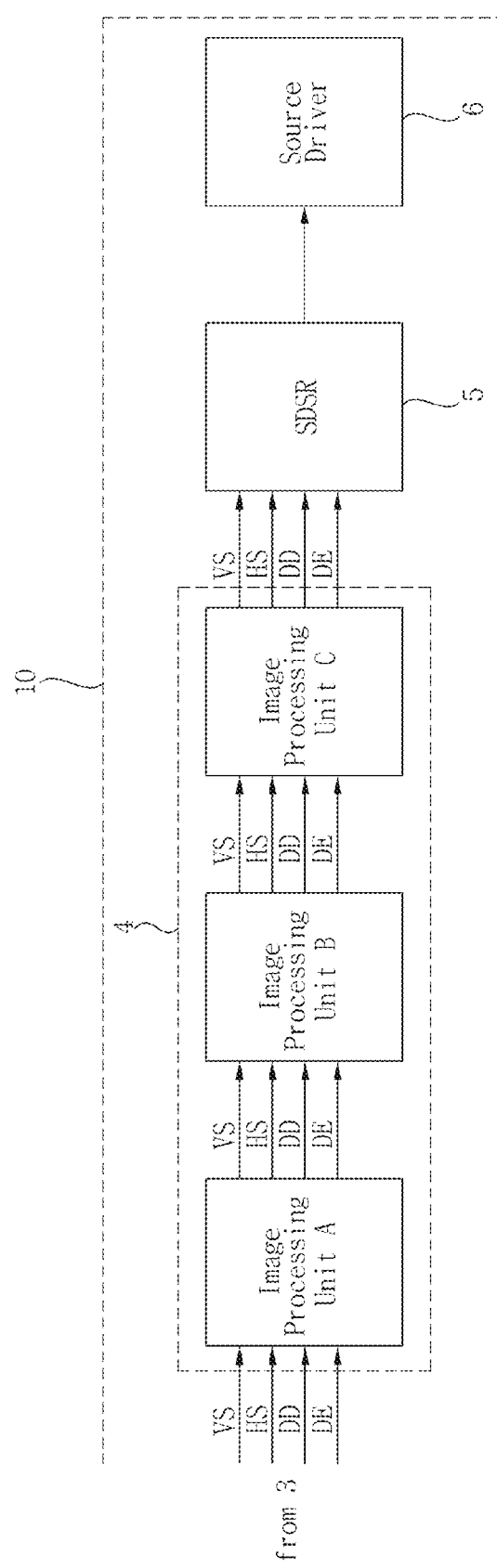

FIGS. 2A and 2B are block diagrams illustrating a DDI according to the related art.

Referring to FIGS. 2A and 2B, the DDI 10 according to the related art may include a high speed serial interface (HSSI) block 1, an interface control unit 2, a graphic memory 3, an image processor 4, a source data shift register (SDSR) 5, and a source driver 6.

The host 50 transmits a data line signal DL and a clock line signal CL to the HSSI block 1. In an example embodiment, the host 50 may include an application processor.

The HSSI block 1 transforms the data line signal DL and the clock line signal CL that are transmitted from the host 50 into a vertical sync signal VS, a horizontal sync signal HS, a display data signal DD, and a data enable signal DE.

The HSSI block 1 transmits the vertical sync signal VS, the horizontal sync signal HS, the display data signal DD, and the data enable signal DE to the source driver 6 through the interface control unit 2, the graphic memory 3, the image processor 4, and the source data shift register 5. For example, the image processor 4 may include an image processing unit A, an image processing unit B, and an image processing unit C.

In an example embodiment, the HSSI block 1 may include a mobile industry processor interface (MIPI).

Figure 3A:
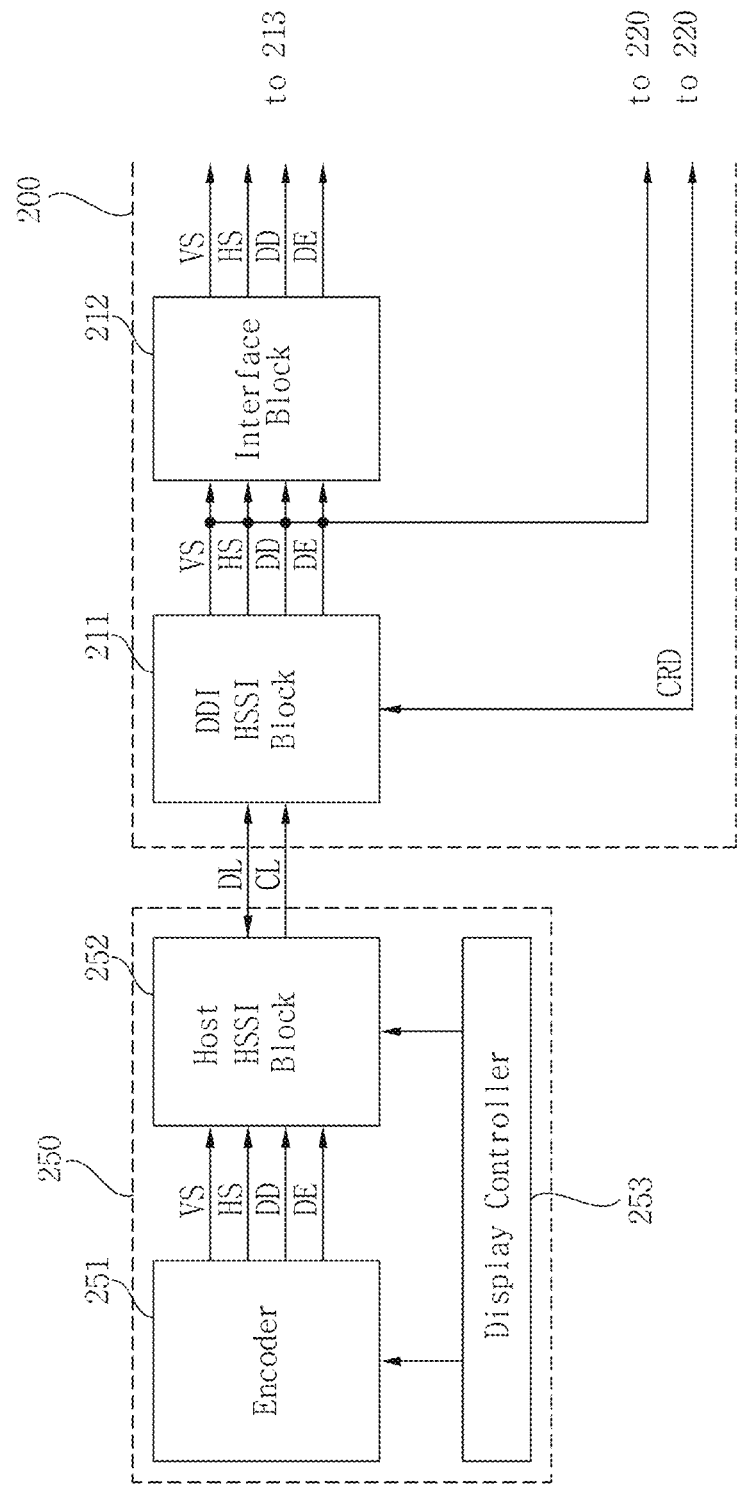
FIGS. 3A and 3B are block diagrams illustrating a DDI according to an example embodiment of the inventive concepts.
Figure 3B:
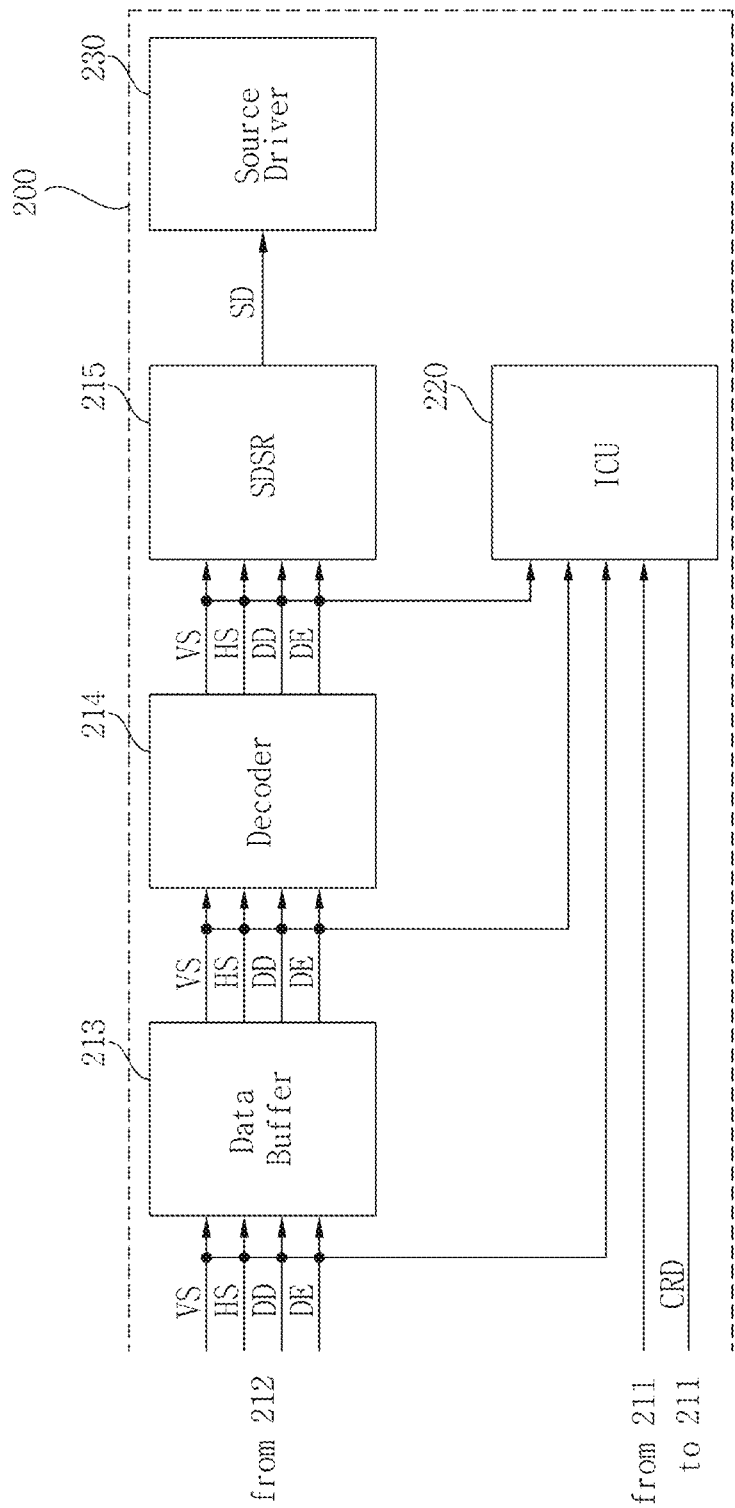

FIGS. 3A and 3B are block diagrams illustrating a DDI according to an example embodiment of the inventive concepts.

Referring to FIGS. 3A and 3B, the DDI 200 according to an example embodiment of the inventive concepts may include a DDI HSSI block 211, an interface block 212, a data buffer 213, a decoder 214, an SDSR 215, an image CRC unit (ICU) 220, and a source driver 230.

The host 250 may include an encoder 251, a host HSSI block 252, and a display controller 253. In an example embodiment, the host 250 may include an application processor.

The encoder 251 may generate a vertical sync signal VS, a horizontal sync signal HS, a display data signal DD, and a data enable signal DE.

In response to control of the display controller 253, the encoder 251 may transmit the vertical sync signal VS, the horizontal sync signal HS, the display data signal DD, and the data enable signal DE to the host HSSI block 252.

The host HSSI block 252 may transform the vertical sync signal VS, the horizontal sync signal HS, the display data signal DD, and the data enable signal DE into a data line signal DL and a clock line signal CL.

In response to control of the display controller 253, the host HSSI block 252 may transmit the data line signal DL and the clock line signal CL to the DDI HSSI block 211.

The DDI HSSI block 211 may receive the data line signal DL and the clock line signal CL. The DDI HSSI block 211 may transform the line signal DL and the clock line signal CL into the vertical sync signal VS, the horizontal sync signal HS, the display data signal DD, and the data enable signal DE.

The vertical sync signal VS, the horizontal sync signal HS, the display data signal DD, and the data enable signal DE transmitted from the DDI HSSI block 211 may be transmitted to the SDSR 215 through the interface block 212, the data buffer 213, and the decoder 214. The SDSR 215 may transmit source driver data SD to the source driver 230.

The ICU 220 may receive output signals (e.g., the vertical sync signal VS, the horizontal sync signal HS, the display data signal DD, and the data enable signal DE) from the interface block 212, the data buffer 213, and the decoder 214. The ICU 220 may perform an error check operation, such as a cyclic redundancy check (CRC) operation, on each of the DDI HSSI block 211, the interface block 212, the data buffer 213, and the decoder 214. While the example embodiments are discussed in reference to use of a CRC operation for the sake of brevity and clarity, it should be understood that other types of error detection and error check operations may also be used in accordance with the inventive concepts and example embodiments discussed herein.

To reduce the image data size, the encoder 251 may encode the image data. The decoder 214 may decode the encoded image data.

The ICU 220 may generate a CRC result data (CRD) signal using a result from the above performance. The ICU 220 may transmit the CRD signal CRD to the DDI HSSI block 211.

The host 250 may receive the CRD signal CRD through the host HSSI block 252 and the DDI HSSI block 211. The host 250 may analyze the CRD signal CRD and determine whether the DDI 200 is operating acceptably.

Moreover, the CRD signal CRD may be used to generate a log file to be used for analyzing the operation of a failed IP block from the plurality of IP blocks included in the DDI 200. An IP block (IP), which may also be known as an IP core or logic block, refers to a reusable unit of logic, cell, or semiconductor chip layout design used for the design and manufacture of integrated circuits.

The ICU 220 according to an example embodiment of the inventive concepts will be described in FIGS. 4 and 5 in detail.

In the DDI 200, the DDI HSSI block 211, the interface block 212, the data buffer 213, and the decoder may be tested. Accordingly, fault coverage of the DDI 200 may be reduced.

Figure 4:
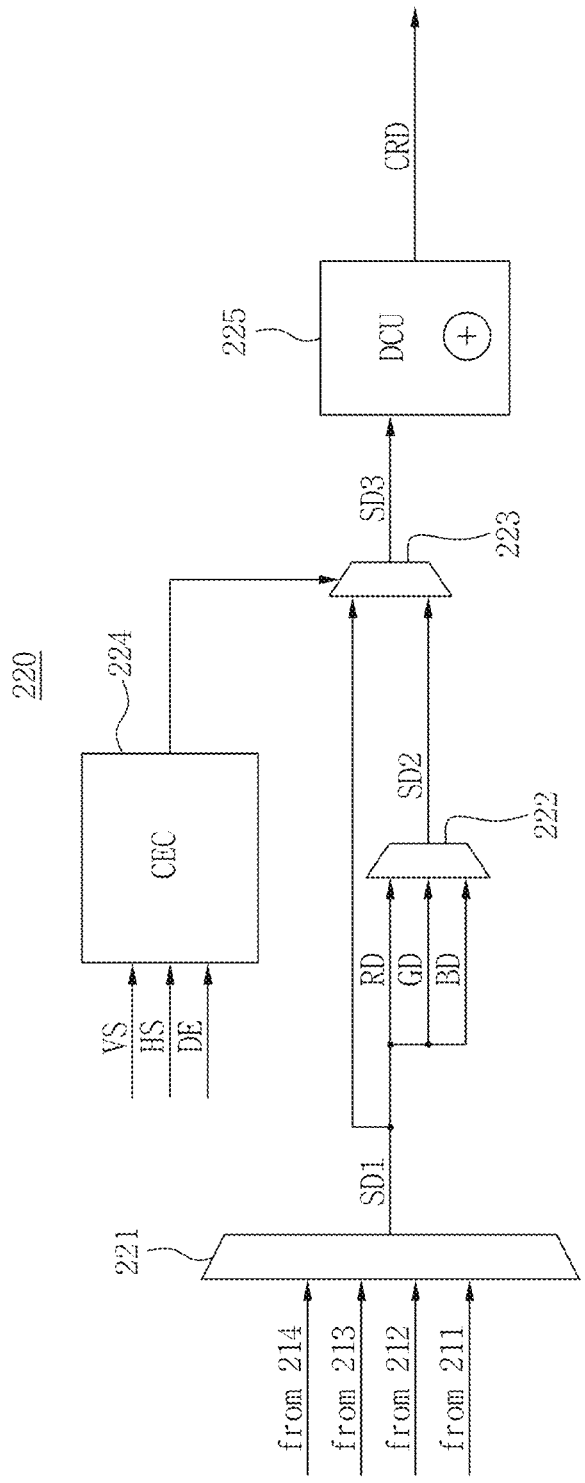
FIG. 4 is a block diagram illustrating an image CRC unit (ICU) shown in FIG. 3B.

FIG. 4 is a block diagram illustrating the ICU shown in FIG. 3B.

Referring to FIGS. 3A, 3B, and 4, the ICU 220 may include a first selection circuit 221, a second selection circuit 222, a third selection circuit 223, a CRC enable controller (CEC) 224, and a data CRC unit (DCU) 225.

The first selection circuit 221 may output any one of outputs of the DDI HSSI block 211, the interface block 212, a data buffer 213, and the decoder 214 as first selection data SD1.

The second selection circuit 222 may output any one of red data RD, green data GD, and blue data BD in the first selection data SD1 as second selection data SD2.

In response to control of the CEC 224, the third selection circuit 223 may select any one of the first selection data SD1 and the second selection data SD2, and may output the selected data as third selection data SD3.

The DCU 225 may perform a cyclical redundancy check (CRC) operation using the third selection data SD3 transmitted from the third selection circuit 223. For example, the DCU 225 may continuously check redundancy with respect to the third selection data SD3 and accumulate the redundancy. Additionally, the DCU 225 may generate the CRD. The DCU 225 according to an example embodiment of the inventive concepts will be described in FIG. 5.

The DCU 225 may transmit the CRD signal CRD to the DDI HSSI block 211. The host 250 may receive the CRD signal CRD through the DDI HSSI block 211. The host 250 may determine whether the logic circuit within the DDI 200 that is being tested performed acceptably by analyzing the CRD signal CRD.

Figure 5:
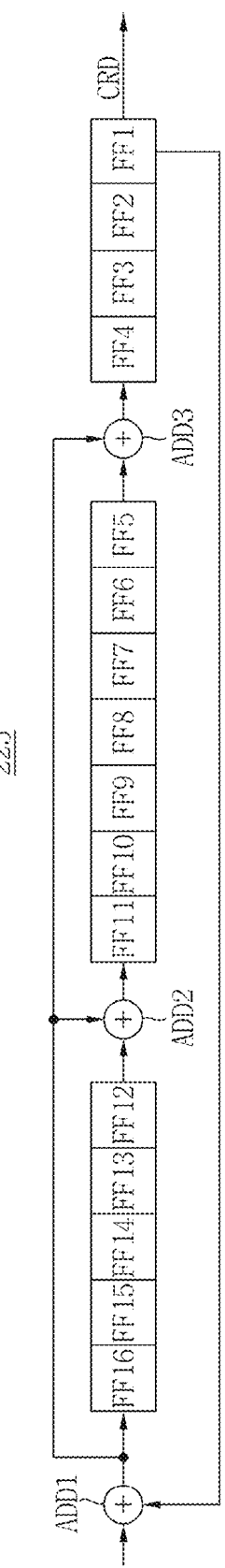
FIG. 5 is a block diagram illustrating a data CRC unit (DCU) shown in FIG. 4.

FIG. 5 is a block diagram illustrating the DCU shown in FIG. 4.

Referring to FIGS. 4 and 5, the DCU 225 may detect an error using the CRC operation.

In an example embodiment, the DCU 225 may be represented as a polynomial. For example, the DCU 225 may be represented as a polynomial P(x) according to Equation 1.

$$P(x)=X^{16}+X^{12}+X^{5}+X^{0}$$ [Equation 1]

For example, the DCU 225 may be formed as a CRC circuit of 16 bits according to Equation 1. Here, the DCU 225 may include sixteen flip-flops and three adders.

In other words, the DCU 225 may include the first to sixteenth flip-flops FF1 to FF16 and first to third adders ADD1 to ADD3.

In response to control of the CEC 224, the third selection circuit 223 may select any one of the first selection data SD1 and the second selection data SD2, and may output the selected data as a third selection data SD3.

The first adder ADD1 may add an output of the first flip-flop FF1 to the third selection data SD3 and may transmit the added result to the sixteenth flip-flop FF16.

An output of the sixteenth flip-flop FF16 may be shifted to the fifteenth flip-flop FF15. An output of the fifteenth flip-flop FF15 may be shifted to the fourteenth flip-flop FF14. An output of the fourteenth flip-flop FF14 may be shifted to the thirteenth flip-flop FF13. An output of the thirteenth flip-flop FF13 may be shifted to the twelfth flip-flop FF12. An output of the twelfth flip-flop FF12 may be shifted to the second adder ADD2.

The second adder ADD2 may add an output of the twelfth flip-flop FF12 to the output of the first adder ADD1 and may transmit the added result to the eleventh flip-flop FF11.

An output of the eleventh flip-flop FF11 may be shifted to the tenth flip-flop FF10. An output of the tenth flip-flop FF10 may be shifted to the ninth flip-flop FF9. An output of the ninth flip-flop FF9 may be shifted to the eighth flip-flop FF8. An output of the eighth flip-flop FF8 may be shifted to the seventh flip-flop FF7. An output of the seventh flip-flop FF7 may be shifted to the sixth flip-flop FF6. An output of the sixth flip-flop FF6 may be shifted to the fifth flip-flop FF5. An output of the fifth flip-flop FF5 may be shifted to the third adder ADD3.

The third adder ADD3 may add an output of the fifth flip-flop FF5 to the output of the first adder ADD1 and may transmit the added result to the fourth flip-flop FF4.

An output of the fourth flip-flop FF4 may be shifted to the third flip-flop FF3. An output of the third flip-flop FF3 may be shifted to the second flip-flop FF2. An output of the second flip-flop FF2 may be shifted to the first flip-flop FF1. An output of the first flip-flop FF1 may be shifted to the first adder ADD1.

The DCU 225 may output the output value of the first flip-flop FF1 as the CRD signal CRD.

Figure 6A:
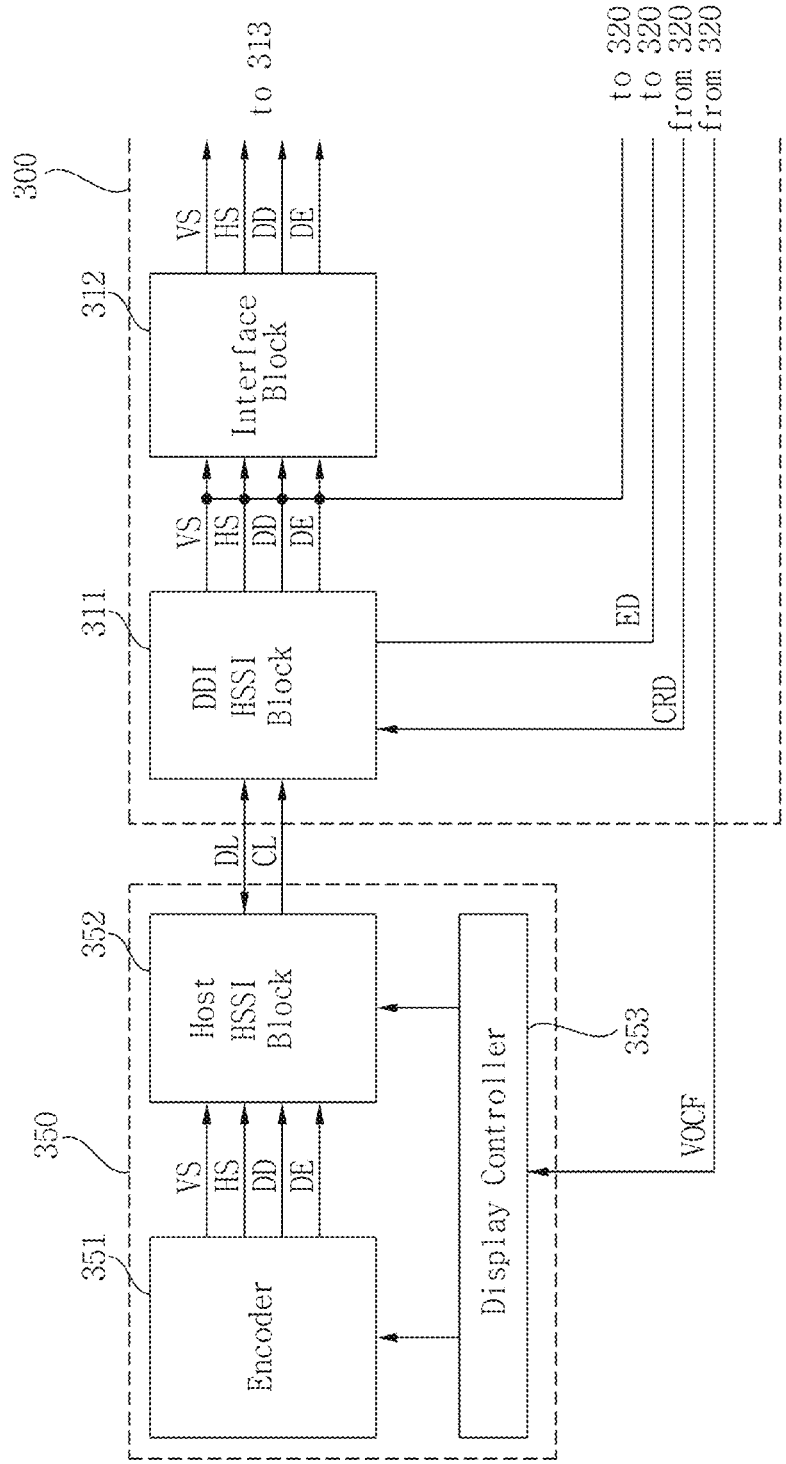
FIGS. 6A and 6B are block diagrams illustrating a DDI according to another example embodiment of the inventive concepts.
Figure 6B:
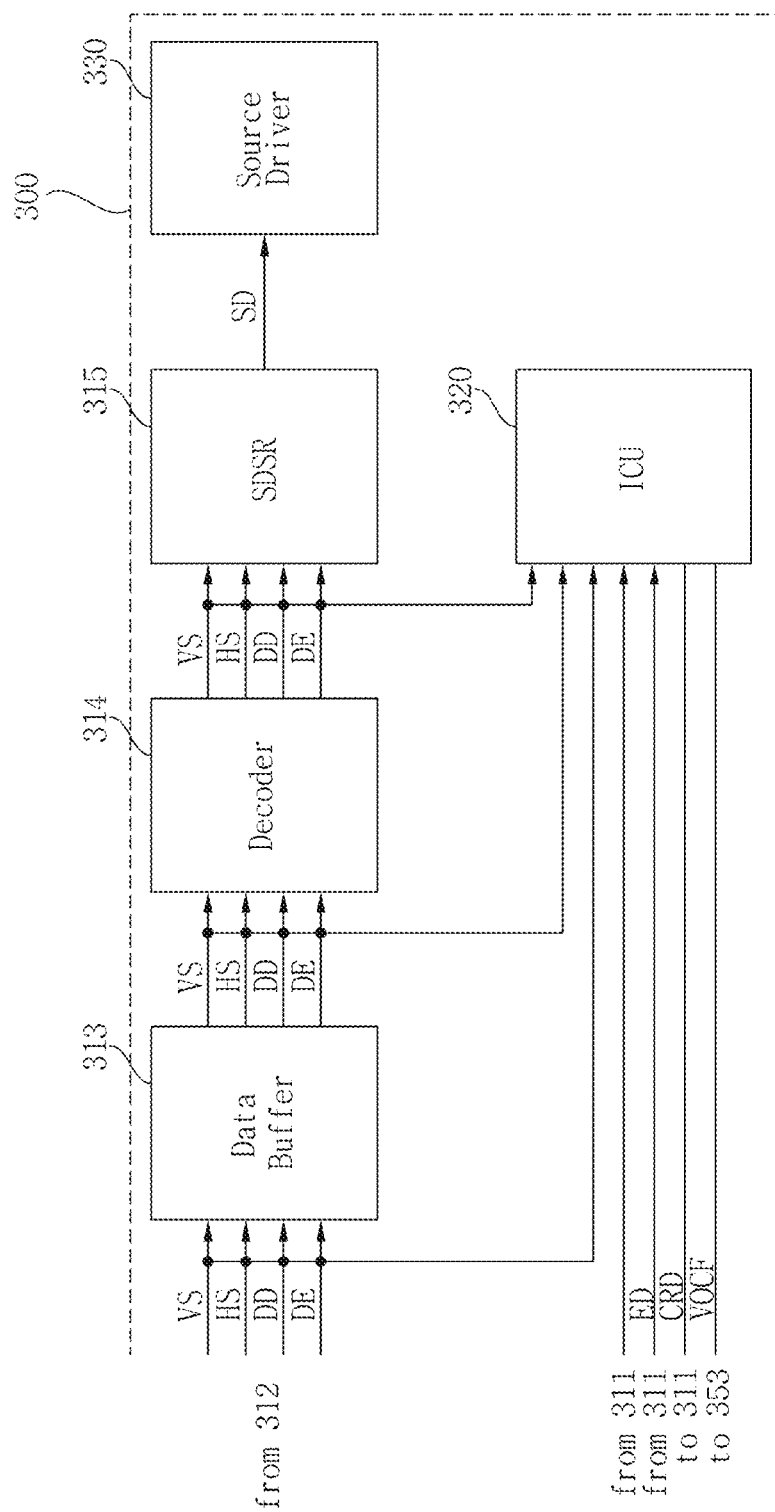

FIGS. 6A and 6B are block diagrams illustrating a DDI according to another example embodiment of the inventive concepts.

Referring to FIGS. 6A and 6B, the DDI 300 according to another example embodiment of the inventive concepts may include a DDI HSSI block 311, an interface block 312, a data buffer 313, a decoder 314, an SDSR 315, an ICU 320, and a source driver 330.

The host 350 may include an encoder 351, a host HSSI block 352, and a display controller 353. In an example embodiment, the host 350 may include an application processor.

The encoder 351 may generate a vertical sync signal VS, a horizontal sync signal HS, a display data signal DD, and a data enable signal DE.

In response to control of the display controller 353, the encoder 351 may transmit the vertical sync signal VS, the horizontal sync signal HS, the display data signal DD, and the data enable signal DE to the host HSSI block 352.

The host HSSI block 352 may transform the vertical sync signal VS, the horizontal sync signal HS, the display data signal DD, and the data enable signal DE into a data line signal DL and a clock line signal CL.

In response to control of the display controller 353, the host HSSI block 352 may transmit the data line signal DL and the clock line signal CL to the DDI HSSI block 311.

The DDI HSSI block 311 may receive the data line signal DL and the clock line signal CL. The DDI HSSI block 311 may transform the line signal DL and the clock line signal CL into the vertical sync signal VS, the horizontal sync signal HS, the display data signal DD, and the data enable signal DE.

The vertical sync signal VS, the horizontal sync signal HS, the display data signal DD, and the data enable signal DE transmitted from the DDI HSSI block 311 may be transmitted to the SDSR 315 through the interface block 312, the data buffer 313, and the decoder 314. The SDSR 315 may transmit source driver data SD to the source driver 330.

The ICU 320 may receive output signals (e.g., the vertical sync signal VS, the horizontal sync signal HS, the display data signal DD, and the data enable signal DE) from the DDI HSSI block 311, the interface block 312, the data buffer 313, and the decoder 314. The ICU 320 may perform a CRC operation on each of the DDI HSSI block 311, the interface block 312, the data buffer 313, and the decoder 314.

The ICU 320 may transmit a CRC result data (CRD) signal to the DDI HSSI block 311 as a result, when the CRC operation is performed.

The host 350 may receive the CRD signal CRD through the host HSSI block 352 and the DDI HSSI block 311. The host 350 may analyze the CRD signal CRD and determine whether the DDI 300 is operating acceptably.

The ICU 320 according to an example embodiment of the inventive concepts will be described in FIG. 7 in detail.

Moreover, the ICU 320 may receive an expected data signal ED through the DDI HSSI block 311 from the host 350. The ICU 320 may compare the ED signal ED with the CRD signal CRD and may generate a valid output comparison flag (VOCF) signal VOCF. The ICU 320 may transmit the VOCF signal VOCF to the display controller 353. That is, the host 350 may determine whether the DDI 300 is operating acceptably by examining the VOCF signal VOCF.

Further, the host 350 may monitor display data through the VOCF signal VOCF. The host 350 may detect a case in which a display panel is not displayed normally. Here, the host 350 may control the DDI 300 so as to normally operate the display panel.

Figure 7:
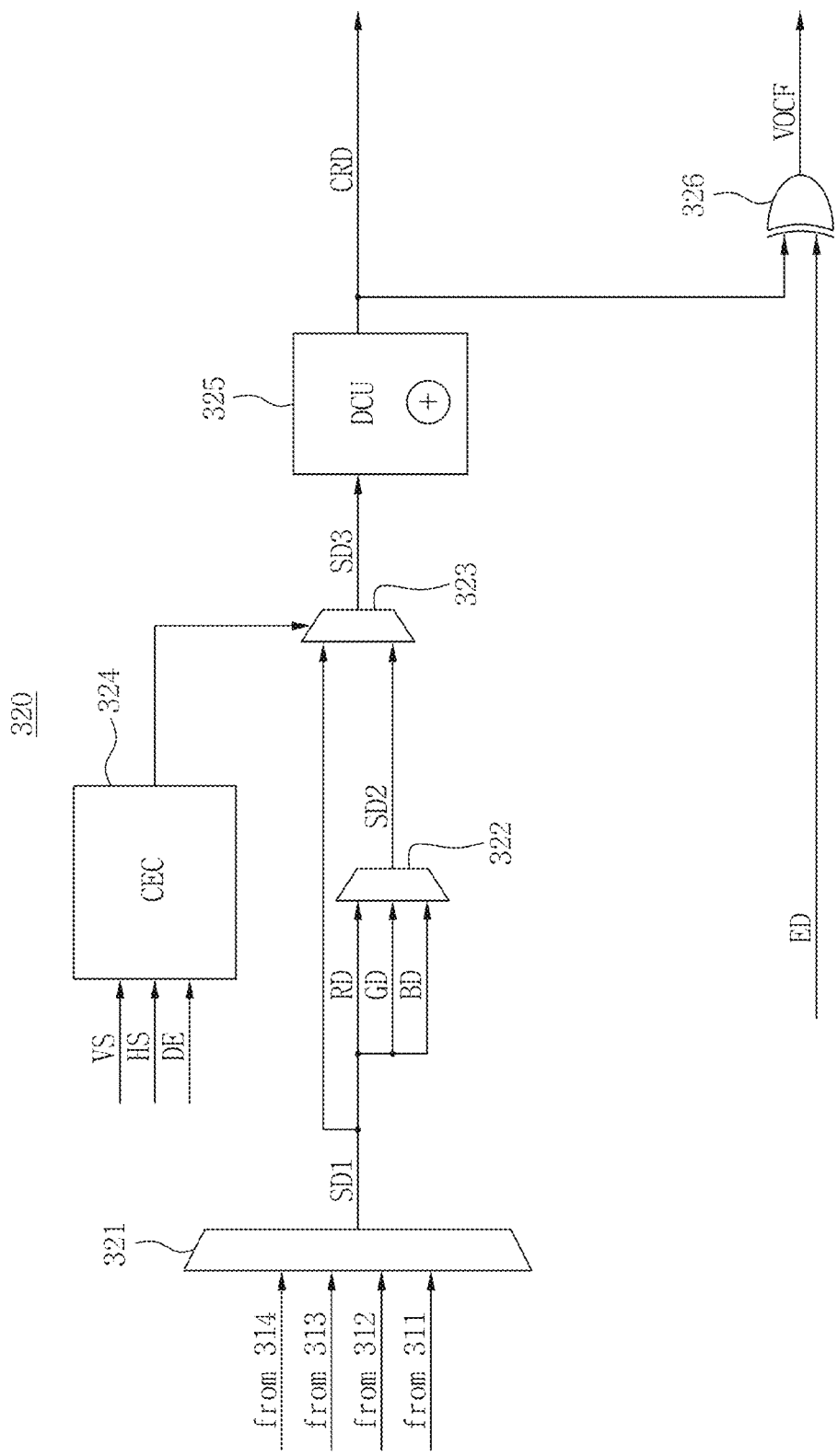
FIG. 7 is a block diagram illustrating an ICU shown in FIG. 6B.

FIG. 7 is a block diagram illustrating the ICU shown in FIG. 6B.

Referring to FIGS. 6A, 6B, and 7, the ICU 320 may include a first selection circuit 321, a second selection circuit 322, a third selection circuit 323, a CEC 324, a DCU 325, and an XOR gate 326.

The first selection circuit 321 may output any one of outputs of the DDI HSSI block 311, the interface block 312, a data buffer 313, and the decoder 314 as first selection data SD1.

The second selection circuit 322 may output any one of red data RD, green data GD, and blue data BD in the first selection data SD1 as second selection data SD2.

In response to control of the CEC 324, the third selection circuit 323 may select any one of the first selection data SD1 and the second selection data SD2, and may output the selected data as third selection data SD3.

The DCU 325 may perform a CRC operation using the third selection data SD3 transmitted from the third selection circuit 323. For example, the DCU 325 may continuously check redundancy with respect to the third selection data SD3 and accumulate the redundancy. Finally, the DCU 325 may generate the CRD.

The DCU 325 may transmit the CRD signal CRD to the DDI HSSI block 311. The host 350 may receive the CRD signal CRD through the DDI HSSI block 311. The host 350 may determine whether the DDI 300 is operating acceptably by analyzing the CRD signal CRD.

Moreover, the XOR gate 326 may generate the VOCF signal VOCF by comparing the ED signal ED with the CRD signal CRD. The ICU 320 may transmit the VOCF signal to the display controller 353. That is, the host 350 may determine whether the DDI 300 is operating acceptably by examining the VOCF signal VOCF.

Figure 8A:
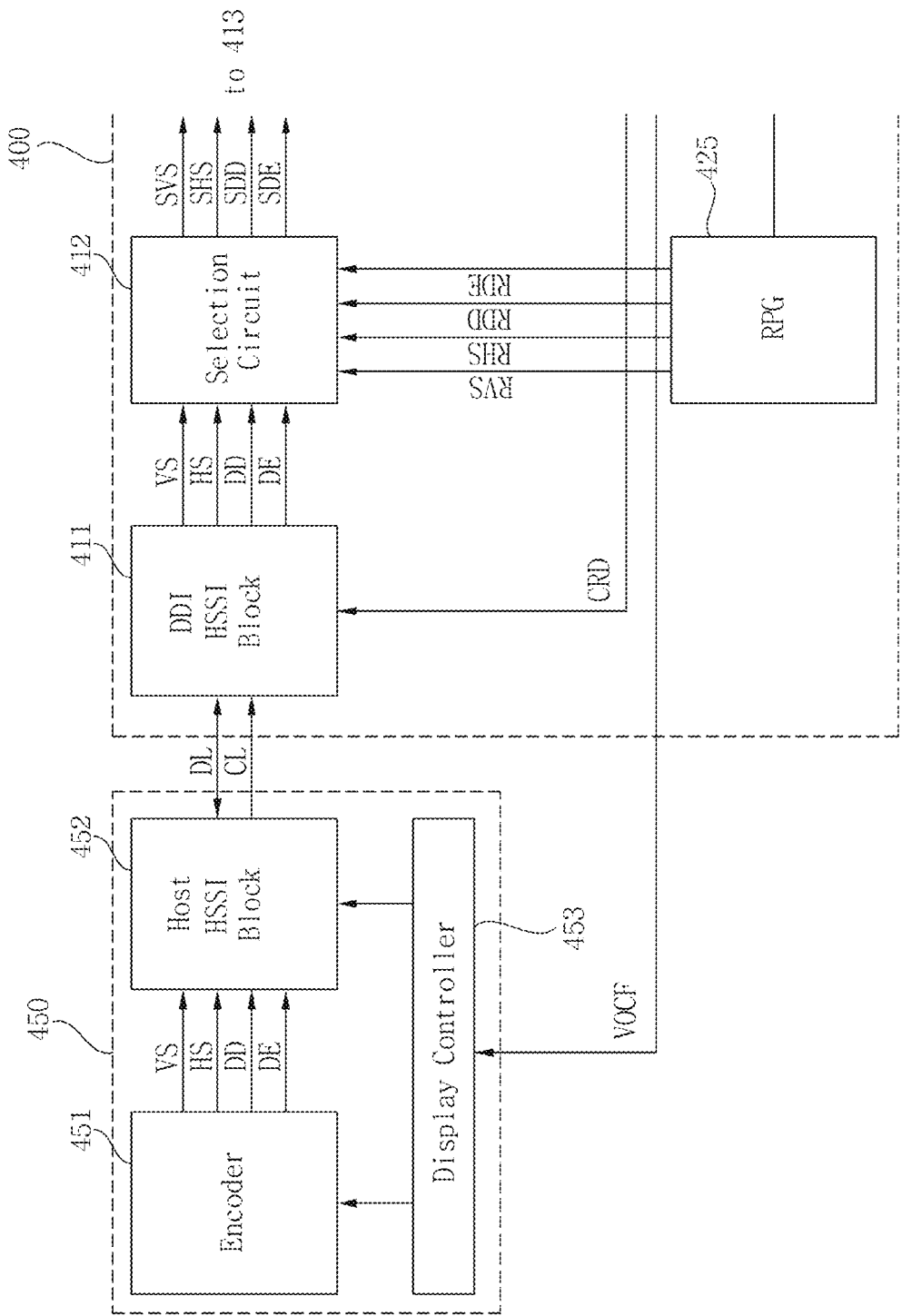
FIGS. 8A and 8B are block diagrams illustrating a DDI according to still another example embodiment of the inventive concepts.
Figure 8B:
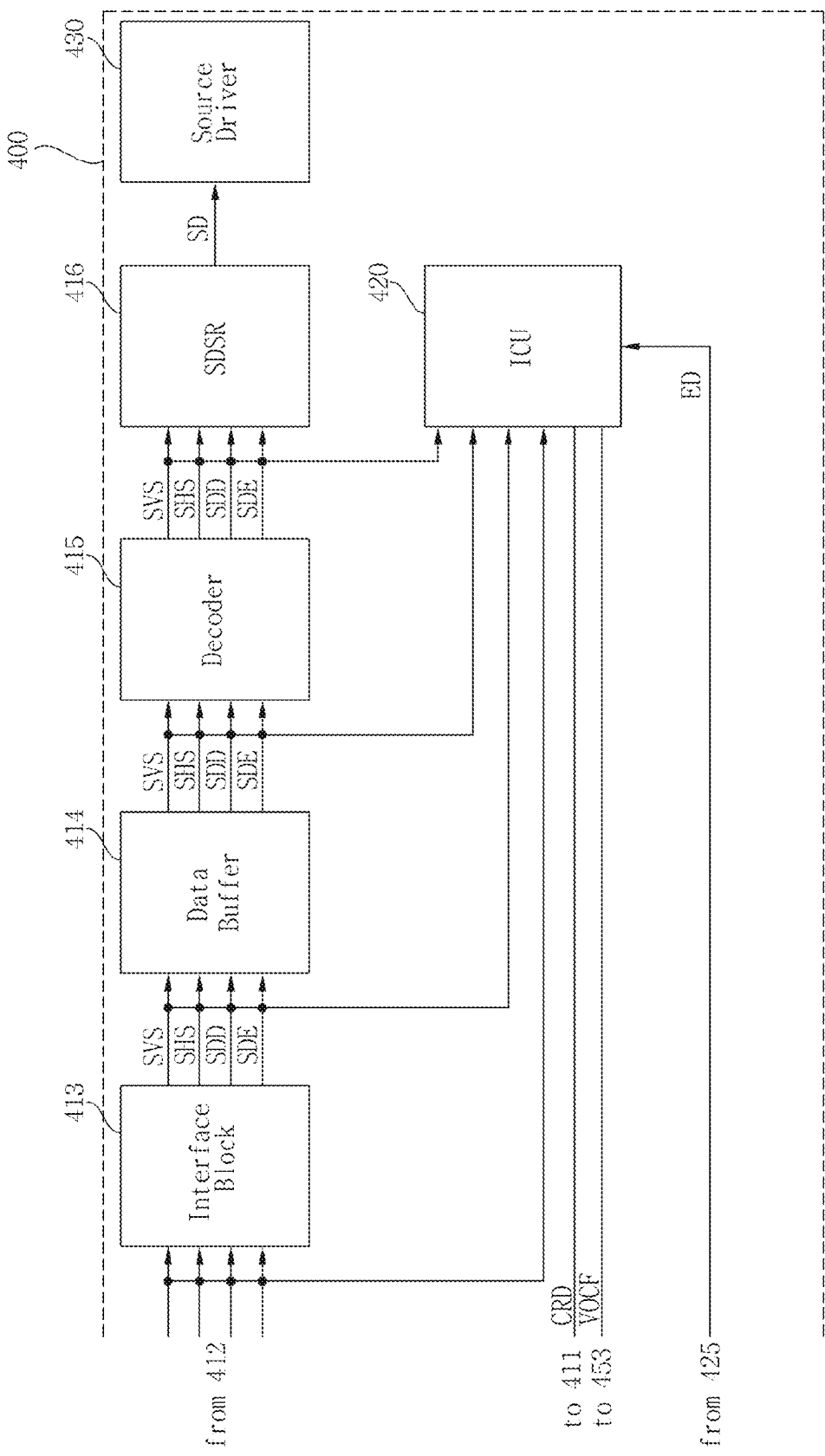

FIGS. 8A and 8B are block diagrams illustrating a DDI according to still another example embodiment of the inventive concepts.

Referring to FIGS. 8A and 8B, the DDI 400 according to still another example embodiment of the inventive concepts may include a DDI HSSI block 411, a selection circuit 412, an interface block 413, a data buffer 414, a decoder 415, an SDSR 416, an ICU 420, a reference pattern generator (RPG) 425, and a source driver 430.

The host 450 may include an encoder 451, a host HSSI block 452, and a display controller 453. In an example embodiment, the host 450 may include an application processor.

The encoder 451 may generate a vertical sync signal VS, a horizontal sync signal HS, a display data signal DD, and a data enable signal DE.

In response to control of the display controller 453, the encoder 451 may transmit the vertical sync signal VS, the horizontal sync signal HS, the display data signal DD, and the data enable signal DE to the host HSSI block 452.

The host HSSI block 452 may transform the vertical sync signal VS, the horizontal sync signal HS, the display data signal DD, and the data enable signal DE into a data line signal DL and a clock line signal CL.

In response to control of the display controller 453, the host HSSI block 452 may transmit the data line signal DL and the clock line signal CL to the DDI HSSI block 411.

The DDI HSSI block 411 may receive the data line signal DL and the clock line signal CL. The DDI HSSI block 411 may transform the line signal DL and the clock line signal CL into the vertical sync signal VS, the horizontal sync signal HS, the display data signal DD, and the data enable signal DE.

The DDI HSSI block 411 may transmit the vertical sync signal VS, the horizontal sync signal HS, the display data signal DD, and the data enable signal DE to the selection circuit 412.

The RPG 425 may generate a reference pattern data signal for testing the DDI 400. In an example embodiment, the RPG 425 may include any one of an all-black pattern, an all-white pattern, a 1×1 check pattern, a 2×2 check pattern, a 4×4 check pattern, an 8×8 check pattern, a column rainbow pattern, a page rainbow pattern, a 0~255 gray page pattern, a 0~239 gray column pattern, a 20% black & 80% white pattern, a 1(line)×1(line) pattern, a 2(line)×2(line) pattern, a crosstalk A pattern, a crosstalk B pattern, a crosstalk C pattern, and a flicker pattern.

The RPG 425 may output the reference pattern data signal. For example, the reference pattern data signal may include a reference vertical sync signal RVS, a reference horizontal sync signal RHS, a reference display data signal RDD, and a reference data enable signal RDE.

The selection circuit 412 may output any one of output signals of the DDI HSSI block 411 and output signals of the RPG 425 to the interface block 413.

Specifically, the selection circuit 421 may output any one of the vertical sync signal VS, the horizontal sync signal HS, the display data signal DD, and the data enable signal DE or the reference vertical sync signal RVS, the reference horizontal sync signal RHS, the reference display data signal RDD, and the reference data enable signal RDE to the interface block 413.

For example, in a normal mode, the selection circuit 412 transmits an image data signal transmitted from the host 450 to the interface block 413. That is, in the normal mode, the selection circuit 412 may output the vertical sync signal VS, the horizontal sync signal HS, the display data signal DD, and the data enable signal DE to the interface block 413.

Moreover, in a test mode, the selection circuit 412 may transmit a reference pattern data signal transmitted from the RPG 425 to the interface block 413. That is, in the test mode, the selection circuit 412 may output the reference vertical sync signal RVS, the reference horizontal sync signal RHS, the reference display data signal RDD, and the reference data enable signal RDE to the interface block 413.

A selection vertical sync signal SVS, a selection horizontal sync signal SHS, a selection display data signal SDD, and a selection data enable signal SDE transmitted from the selection circuit 412 may be transmitted to the SDSR 416 through the interface block 413, the data buffer 414, and the decoder 415. The SDSR 416 may transmit source driver data SD to the source driver 430.

The ICU 420 may receive output signals (e.g., the vertical sync signal VS, the horizontal sync signal HS, the display data signal DD, and the data enable signal DE) from the selection circuit 412, the interface block 413, the data buffer 414, and the decoder 415. The ICU 420 may perform a CRC operation on each of the selection circuit 412, the interface block 413, the data buffer 414, and the decoder 415.

The ICU 420 may generate a CRD signal CRD using the performed result. The ICU 420 may transmit the CRD signal CRD to the DDI HSSI block 411.

The host 450 may receive the CRD signal CRD through the host HSSI block 452 and the DDI HSSI block 411. The host 450 may analyze the CRD signal CRD and determine whether the DDI 400 is operating acceptably.

Moreover, the ICU 420 may receive an expected data signal ED from the RPG 425. The ICU 420 may compare the ED signal ED with the CRD signal CRD and may generate a valid output comparison flag VOCF signal VOCF. The ICU 420 may transmit the VOCF signal VOCF to the display controller 453.

That is, the host 450 may determine whether the DDI 400 is operating acceptably by examining the VOCF signal VOCF.

Figure 9A:
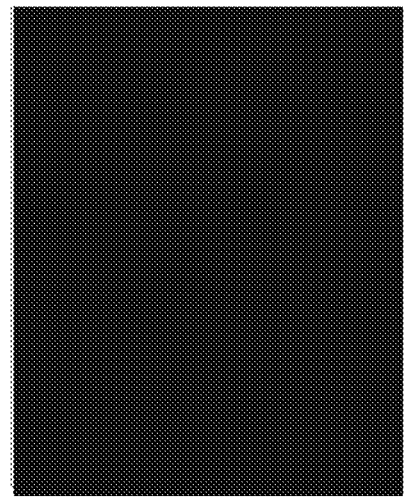
FIG. 9A shows an all-black pattern.
Figure 9B:
FIG. 9B shows an all-white pattern.
Figure 9C:
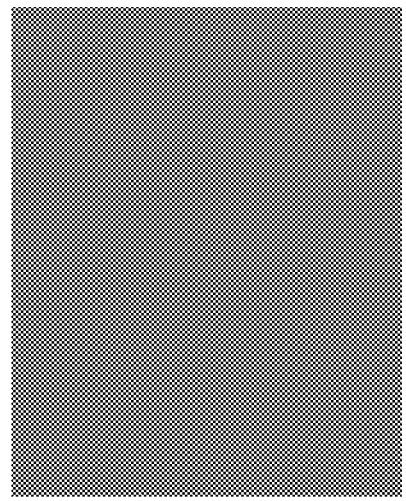
FIG. 9C shows a 1×1 check pattern.
Figure 9D:
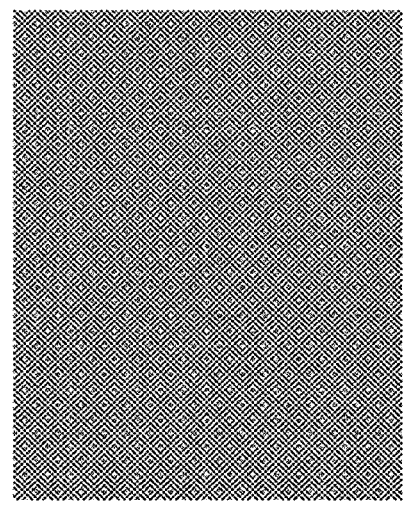
FIG. 9D shows a 2×2 check pattern.
Figure 9E:
FIG. 9E shows a 4×4 check pattern.
Figure 9F:
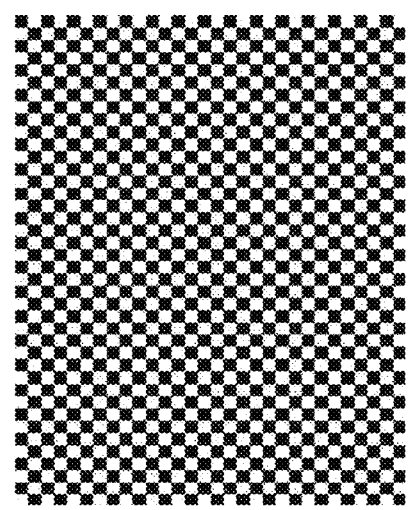
FIG. 9F shows an 8×8 check pattern.
Figure 9G:
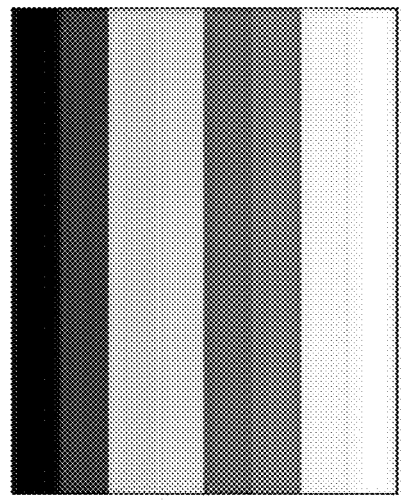
FIG. 9G shows a column rainbow pattern.
Figure 9H:
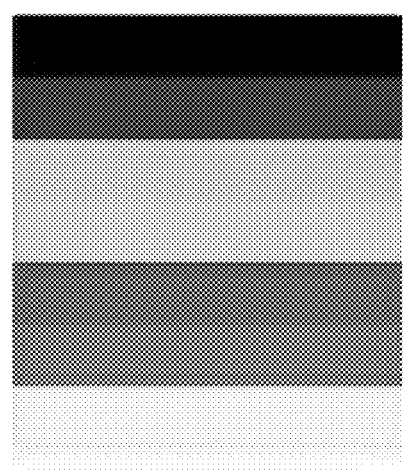
FIG. 9H shows a page rainbow pattern.
Figure 9I:
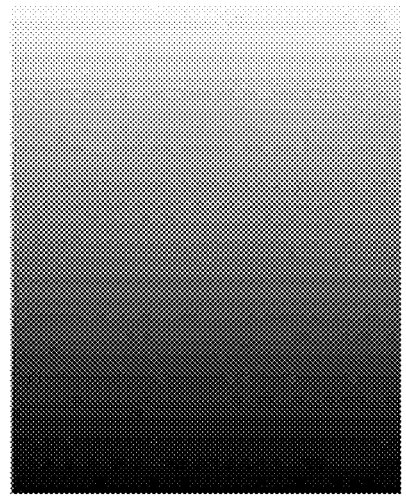
FIG. 9I shows a 0~255 gray page pattern.
Figure 9J:
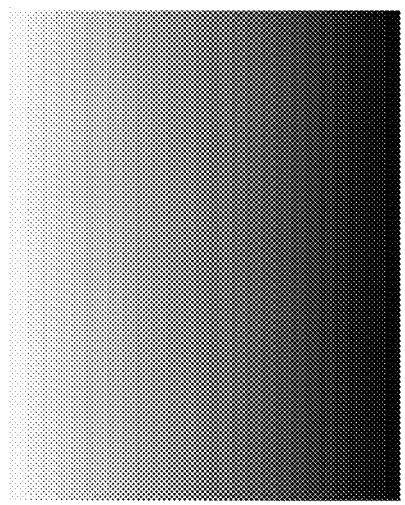
FIG. 9J shows a 0~239 gray column pattern.
Figure 9K:
FIG. 9K shows a 20% black & 80% white pattern.
Figure 9L:
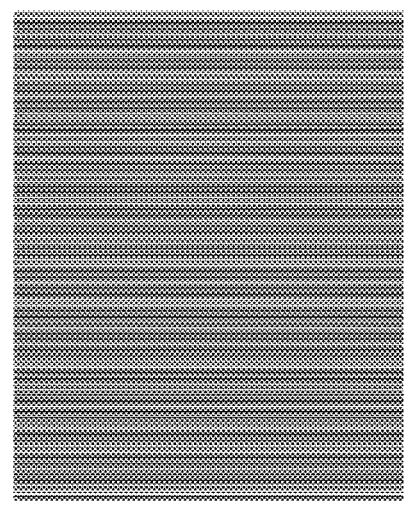
FIG. 9L shows a 1(line)×1(line) pattern.
Figure 9M:
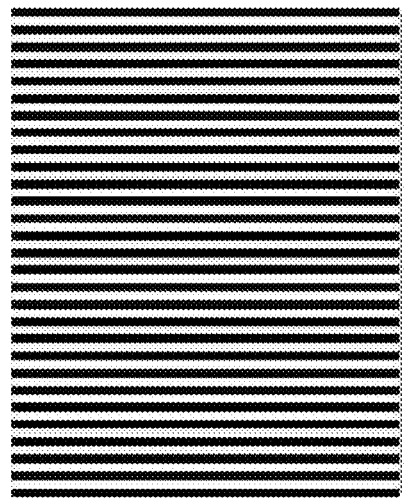
FIG. 9M shows a 2(line)×2(line) pattern.
Figure 9N:
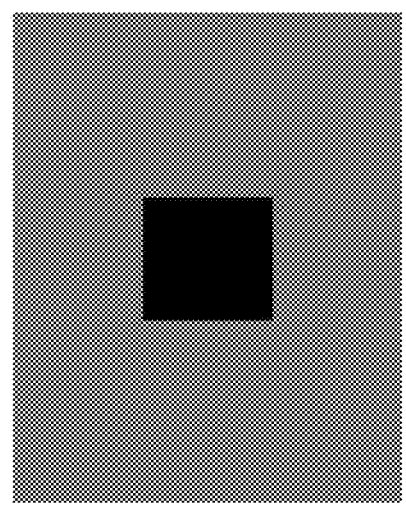
FIG. 9N shows a crosstalk A pattern.
Figure 9O:
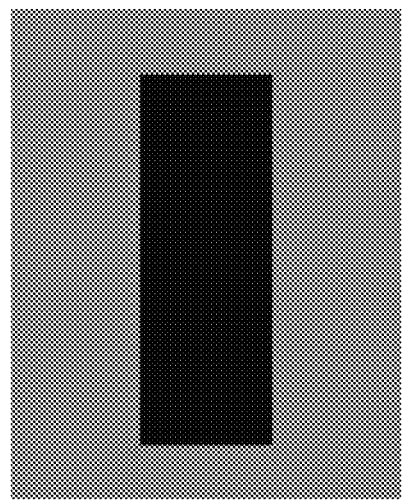
FIG. 9O shows a crosstalk B pattern.
Figure 9P:
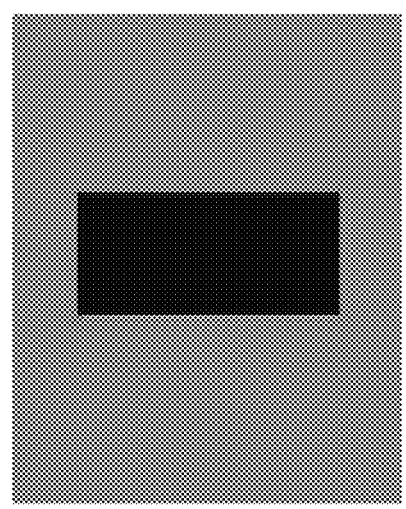
FIG. 9P shows a crosstalk C pattern.
Figure 9Q:
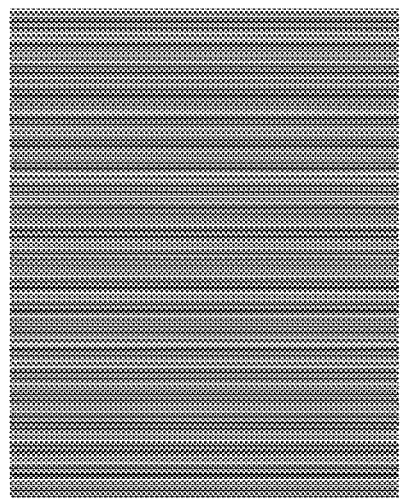
FIG. 9Q shows a flicker pattern.

FIGS. 9A to 9Q show test patterns stored in the RPG shown in FIG. 8B.

FIG. 9A shows an all-black pattern.
Referring to FIG. 9A, the all-black pattern is displayed.
FIG. 9B shows an all-white pattern.
Referring to FIG. 9B, the all-white pattern is displayed.
FIG. 9C shows a 1×1 check pattern.
Referring to FIG. 9C, the 1×1 check pattern is displayed.
FIG. 9D shows a 2×2 check pattern.
Referring to FIG. 9D, the 2×2 check pattern is displayed.
FIG. 9E shows a 4×4 check pattern.
Referring to FIG. 9E, the 4×4 check pattern is displayed.
FIG. 9F shows an 8×8 check pattern.
Referring to FIG. 9F, the 8×8 check pattern is displayed.
FIG. 9G shows a column rainbow pattern.
Referring to FIG. 9G, the column rainbow pattern is displayed.
FIG. 9H shows a page rainbow pattern.
Referring to FIG. 9H, the page rainbow pattern is displayed.
FIG. 9I shows a 0~255 gray page pattern.
Referring to FIG. 9I, the 0~255 gray page pattern is displayed.
FIG. 9J shows a 0~239 gray column pattern.
Referring to FIG. 9J, the 0~239 gray column pattern is displayed.
FIG. 9K shows a 20% black & 80% white pattern.
Referring to FIG. 9K, the 20% black & 80% white pattern is displayed.
FIG. 9L shows a 1(line)×1(line) pattern.
Referring to FIG. 9L, the 1(line)×1(line) pattern is displayed.
FIG. 9M shows a 2(line)×2(line) pattern.
Referring to FIG. 9M, the 2(line)×2(line) pattern is displayed.
FIG. 9N shows a crosstalk A pattern.
Referring to FIG. 9N, the crosstalk A pattern is displayed.
FIG. 9O shows a crosstalk B pattern.
Referring to FIG. 9O, the crosstalk B pattern is displayed.
FIG. 9P shows a crosstalk C pattern.
Referring to FIG. 9P, the crosstalk C pattern is displayed.
FIG. 9Q shows a flicker pattern.
Referring to FIG. 9Q, the flicker pattern is displayed.

Figure 10:
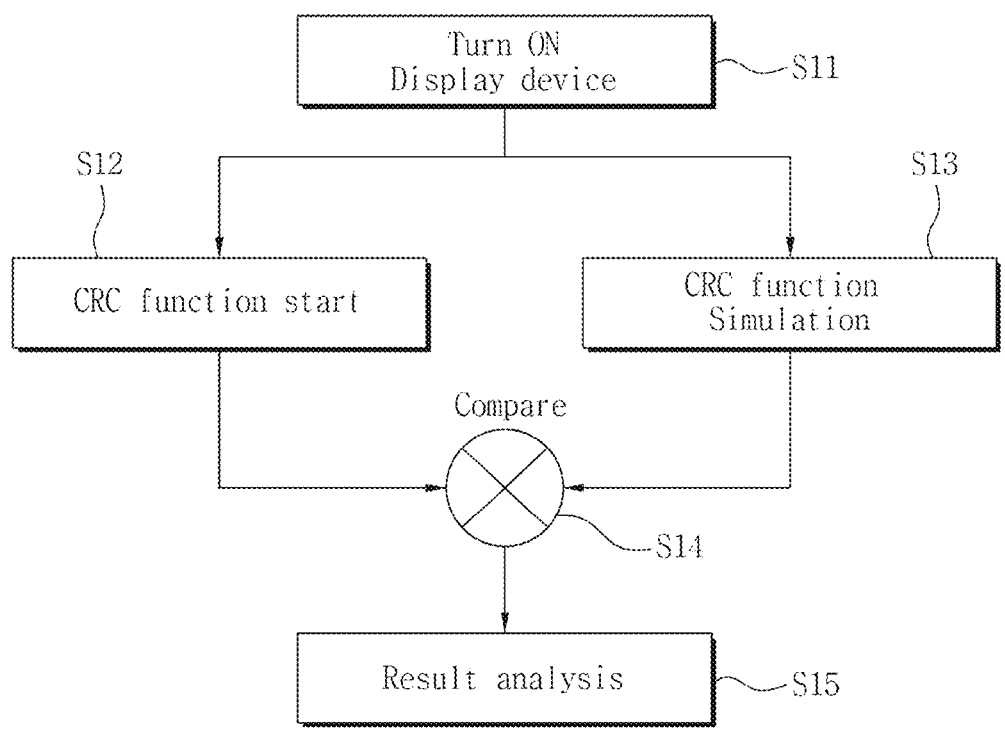
FIG. 10 is a flow chart illustrating a method of driving a DDI according to an example embodiment of the inventive concepts.

FIG. 10 is a flow chart illustrating a method of driving a DDI according to an example embodiment of the inventive concepts.

Referring to FIGS. 1 and 10, in operation S11, the display device 100 turns on. Accordingly, the host 50 may transmit encoded image data to the DDI 10. The DDI 10 may decode the encoded image data. The DDI 10 may transmit the decoded image data to the display panel 20.

In operation S12, the DDI 10 may perform a CRC operation on the decoded image data.

In operation S13, the host 50 may calculate an expected output value with respect to the result where the CRC operation is performed using a simulated image or signals. Further, the DDI 10 may calculate the expected output value.

In operation S14, the host 50 may compare the expected output value with the result where the CRC operation is performed. Further, when calculating the expected output value, the DDI 10 may compare the expected output value with the result where the CRC operation is performed. The DDI 10 may transmit the compared result to the host 50.

In operation S15, the host 50 may analyze the compared result. For example, when the performed result is equal to the expected output value, the DDI 10 is in a normal mode. Otherwise, the DDI 10 is in an abnormal mode. Accordingly, the test engineer may search the IP blocks where a failure occurs, or may debug the failure by further reviewing the results.

Figure 11:
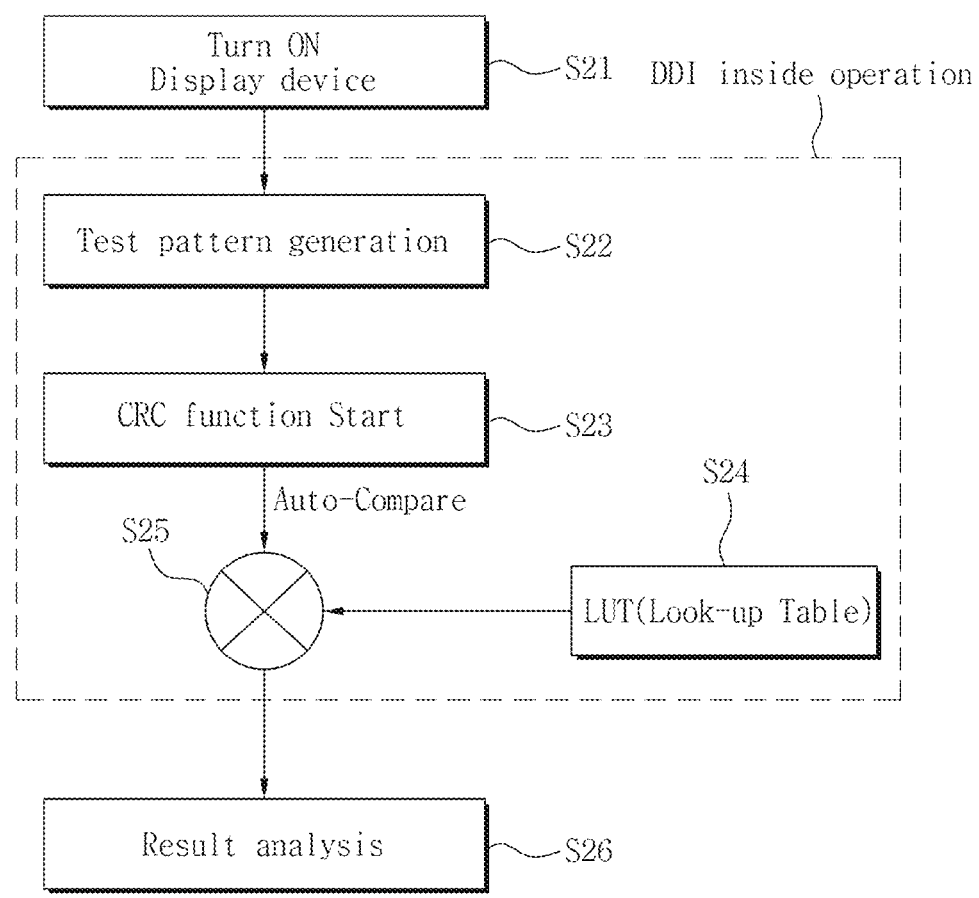
FIG. 11 is a flow chart illustrating a method of driving a DDI according to another example embodiment of the inventive concepts.

FIG. 11 is a flow chart illustrating a method of driving a DDI according to another example embodiment of the inventive concepts.

Referring to FIG. 11, in operation S21, the display device 100 turns on. Accordingly, the host 50 may transmit encoded image data to the DDI 10. The DDI 10 may decode the encoded image data. The DDI 10 may transmit the decoded image data to the display panel 20.

In operation S22, the DDI 10 may generate a test pattern for self-test. For example, the DDI 10 may generate an all-black pattern, an all-white pattern, a 1×1 check pattern, a 2×2 check pattern, a 4×4 check pattern, an 8×8 check pattern, a column rainbow pattern, a page rainbow pattern, a 0~255 gray page pattern, a 0~239 gray column pattern, a 20% black & 80% white pattern, a 1(line)×1(line) pattern, a 2(line)×2(line) pattern, a crosstalk A pattern, a crosstalk B pattern, a crosstalk C pattern, and a flicker pattern.

In operation S23, the DDI 10 may transmit the test pattern to internal IP blocks or internal logic circuits. The DDI 10 may perform a CRC operation on the output signals of the internal IP blocks or internal logic circuits.

In operation S24, the DDI 10 may calculate an expected output value. The DDI 10 may store the calculated expected output value in a look-up table.

In operation S25, the DDI 10 may compare the expected output value stored in the look-up table with the performed result. The DDI 10 may transmit the compared result to the host 50.

In operation S26, the host 50 may analyze the compared result. For example, when the performed result is equal to the expected output value, the DDI 10 is in a normal mode. Otherwise, the DDI 10 is in an abnormal mode.

Figure 12A:
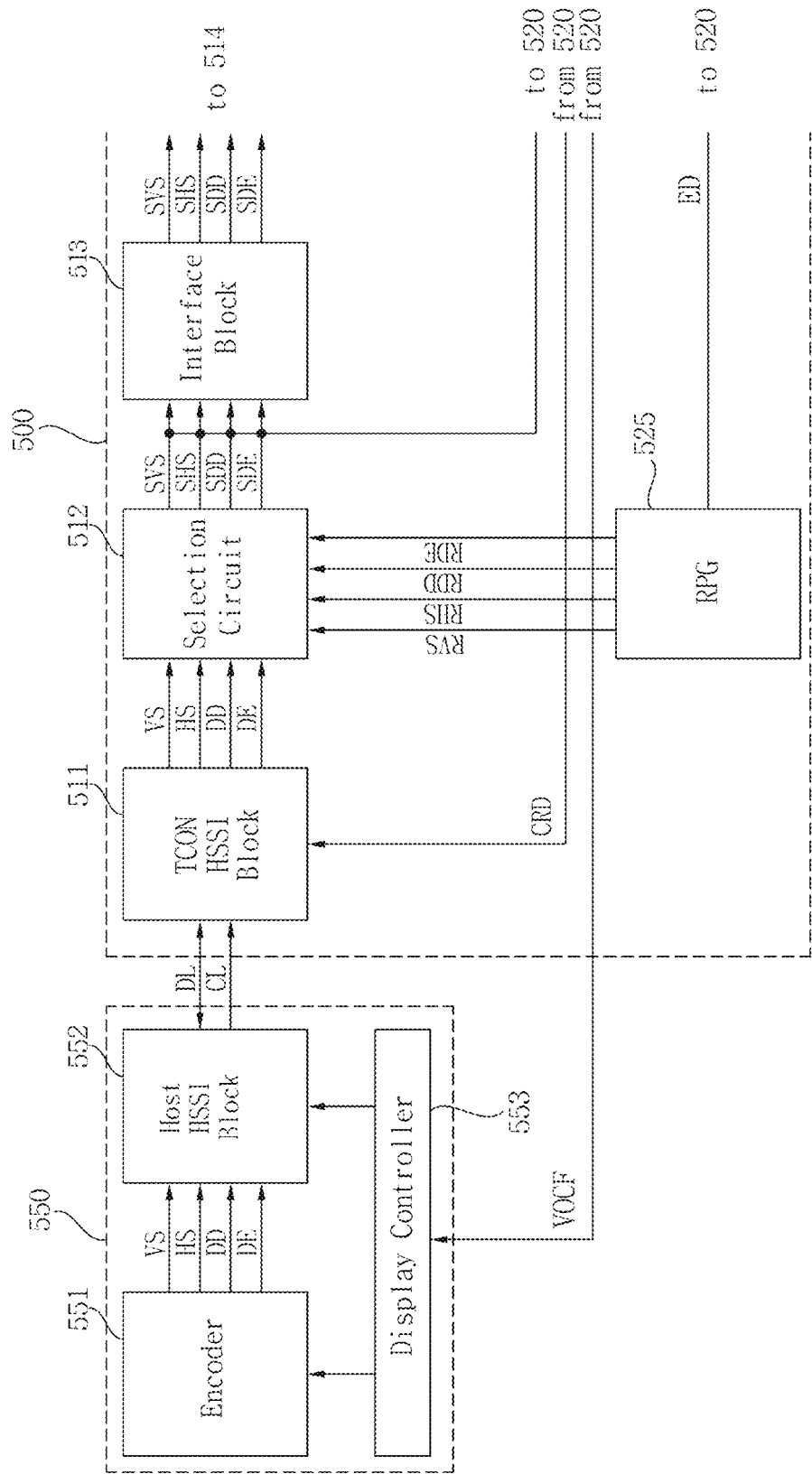
FIGS. 12A and 12B are block diagrams illustrating a timing controller (TCON) according to an example embodiment of the inventive concepts.
Figure 12B:
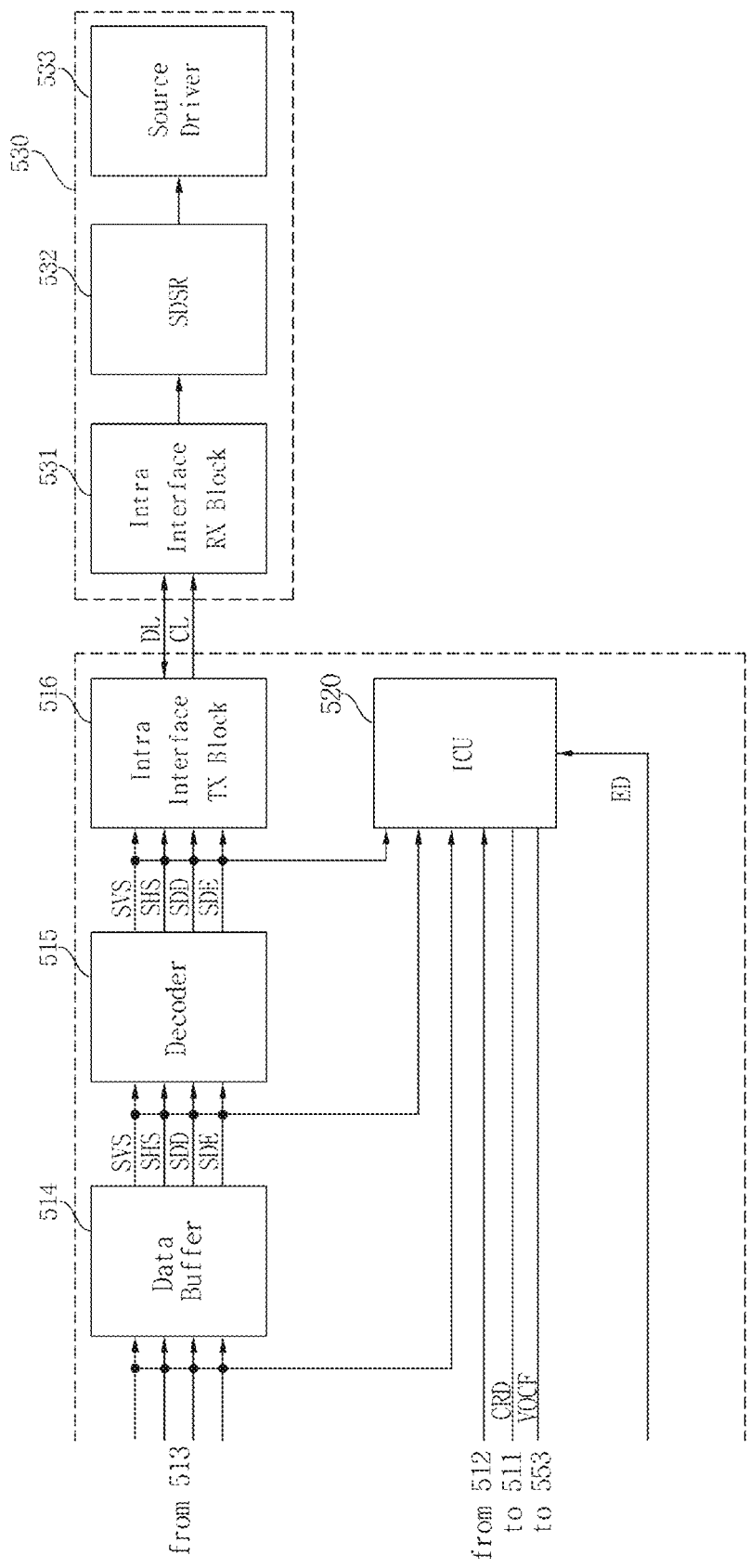

FIGS. 12A and 12B are block diagrams illustrating a timing controller (TCON) according to an example embodiment of the inventive concepts.

Referring to FIGS. 12A and 12B, the TCON 500 according to an example embodiment of the inventive concepts may include a TCON HSSI block 511, a selection circuit 512, an interface block 513, a data buffer 514, a decoder 515, an intra-interface TX block 516, an ICU 520, and a RPG 525.

The host 550 may include an encoder 551, a host HSSI block 552, and a display controller 553. In an example embodiment, the host 550 may include an application processor.

The encoder 551 may generate a vertical sync signal VS, a horizontal sync signal HS, a display data signal DD, and a data enable signal DE.

In response to control of the display controller 553, the encoder 551 may transmit the vertical sync signal VS, the horizontal sync signal HS, the display data signal DD, and the data enable signal DE to the host HSSI block 552.

The host HSSI block 552 may transform the vertical sync signal VS, the horizontal sync signal HS, the display data signal DD, and the data enable signal DE into a data line signal DL and a clock line signal CL.

In response to control of the display controller 553, the host HSSI block 552 may transmit the data line signal DL and the clock line signal CL to the TCON HSSI block 511.

The TCON HSSI block 511 may receive the data line signal DL and the clock line signal CL. The TCON HSSI block 511 may transform the line signal DL and the clock line signal CL into the vertical sync signal VS, the horizontal sync signal HS, the display data signal DD, and the data enable signal DE.

The TCON HSSI block 511 may transmit the vertical sync signal VS, the horizontal sync signal HS, the display data signal DD, and the data enable signal DE to the selection circuit 512.

The RPG 525 may generate a reference pattern data signal for testing the TCON 500. In an example embodiment, the RPG 525 may include any one of an all-black pattern, an all-white pattern, a 1×1 check pattern, a 2×2 check pattern, a 4×4 check pattern, an 8×8 check pattern, a column rainbow pattern, a page rainbow pattern, a 0~255 gray page pattern, a 0~239 gray column pattern, a 20% black & 80% white pattern, a 1(line)×1(line) pattern, a 2(line)×2(line) pattern, a crosstalk A pattern, a crosstalk B pattern, a crosstalk C pattern, and a flicker pattern.

The RPG 525 may output the reference pattern data signal. For example, the reference pattern data signal may include a reference vertical sync signal RVS, a reference horizontal sync signal RHS, a reference display data signal RDD, and a reference data enable signal RDE.

The selection circuit 512 may output any one of output signals of the TCON HSSI block 511 and output signals of the RPG 525 to the interface block 513.

Specifically, the selection circuit 512 may output any one of the vertical sync signal VS, the horizontal sync signal HS, the display data signal DD, and the data enable signal DE or the reference vertical sync signal RVS, the reference horizontal sync signal RHS, the reference display data signal RDD, and the reference data enable signal RDE to the interface block 513.

For example, in a normal mode, the selection circuit 512 may transmit an image data signal transmitted from the host 550 to the interface block 513. That is, in the normal mode, the selection circuit 512 may output the vertical sync signal VS, the horizontal sync signal HS, the display data signal DD, and the data enable signal DE to the interface block 513.

Moreover, in a test mode, the selection circuit 512 may transmit a reference pattern data signal transmitted from the RPG 525 to the interface block 513. That is, in the test mode, the selection circuit 512 may output the reference vertical sync signal RVS, the reference horizontal sync signal RHS, the reference display data signal RDD, and the reference data enable signal RDE to the interface block 513.

A selection vertical sync signal SVS, a selection horizontal sync signal SHS, a selection display data signal SDD, and a selection data enable signal SDE transmitted from the selection circuit 512 may be transmitted to the intra interface TX block 516 through the interface block 513, the data buffer 514, and the decoder 515.

The intra interface TX block 516 may transform the selection vertical sync signal SVS, the selection horizontal sync signal SHS, the selection display data signal SDD, and the selection data enable signal SDE into a data line signal DL and a clock line signal CL. The intra interface TX block 516 may transmit the data line signal DL and the clock line signal CL to a source driver integrated circuit 530.

The source driver integrated circuit 530 may include an intra-interface RX block 531, a source data shift register (SDSR) 532, and a source driver 533.

The source driver 533 may receive image data through the intra interface RX block 531 and SDSR 532.

The ICU 520 may receive output signals (e.g., the vertical sync signal VS, the horizontal sync signal HS, the display data signal DD, and the data enable signal DE) from the selection circuit 512, the interface block 513, the data buffer 514, and the decoder 515. The ICU 520 may perform a CRC operation on each of the selection circuit 512, the interface block 513, the data buffer 514, and the decoder 515.

The ICU 520 may transmit a CRD signal CRD to the TCON HSSI block 511 as a result where the CRC operation is performed.

The host 550 may receive the CRD signal CRD through the host HSSI block 552 and the TCON HSSI block 511. The host 550 may analyze the CRD signal CRD and determine whether the TCON 500 is operating acceptably.

Moreover, the ICU 520 may receive an expected data signal ED from the RPG 525. The ICU 520 may compare the ED signal ED with the CRD signal CRD and generate a valid output comparison flag VOCF signal VOCF. The ICU 520 may transmit the VOCF signal VOCF to the display controller 553. That is, the host 550 may determine whether the TCON 500 is operating adequately by examining the VOCF signal VOCF.

Figure 13:
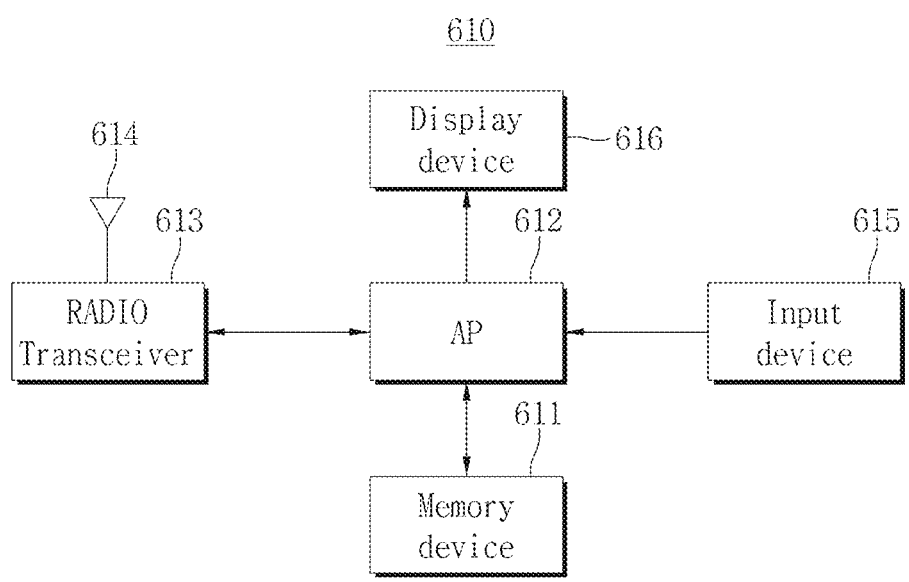
FIG. 13 is a block diagram illustrating a computer system according to an example embodiment of the inventive concepts.

FIG. 13 is a block diagram illustrating a computer system according to an example embodiment of the inventive concepts.

Referring to FIG. 13, the computer system 610 includes a memory device 611, an application processor (AP) 612 including a memory controller for controlling the memory device 611, a radio transceiver 613, an antenna 614, an input device 615, and a display device 616.

The radio transceiver 613 may transmit or receive a radio signal via the antenna 614. For example, the radio transceiver 613 may transform a radio signal received via the antenna 614 into a signal to be processed by the AP 612.

Thus, the AP 612 may process the radio signal output from the radio transceiver 613 and transmit the processed signal to the display device 616. Moreover, the radio transceiver 613 may transform a signal output from the AP 612 into a radio signal and transmit the radio signal to an external device via the antenna 614.

The input device 615 is a device via which a control signal for controlling an operation of the AP 612 or data to be processed by the AP 612 is input, and may be embodied as a pointing device, such as a touch pad and a computer mouse, a keypad, or a keyboard.

In one embodiment, the display device 616 may be embodied to include the display device 100 shown in FIG. 1.

Figure 14:
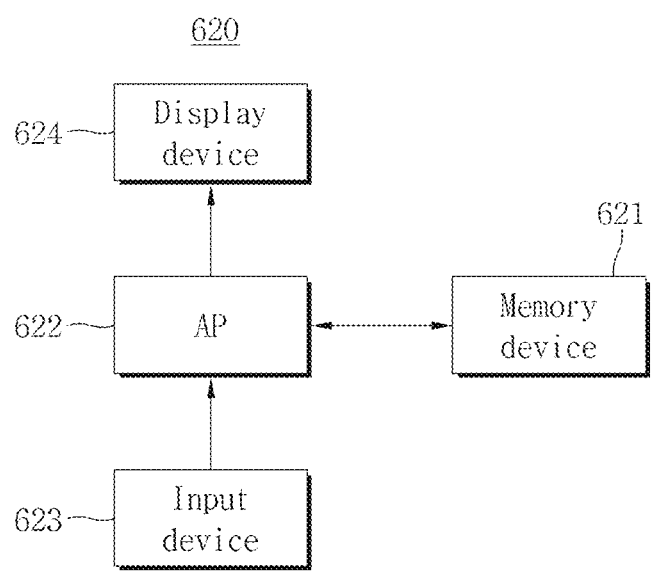
FIG. 14 is a block diagram illustrating a computer system according to another example embodiment of the inventive concepts.

FIG. 14 is a block diagram illustrating a computer system according to another example embodiment of the inventive concepts.

Referring to FIG. 14, the computer system 620 may be embodied as a personal computer (PC), a network server, a table PC, a net-book, an e-reader, a personal digital assistant (PDA), a portable multimedia player (PMP), an MP3 player, or an MP4 player.

The computer system 620 includes a memory device 621, an AP 622 including a memory controller configured to control a data processing operation of the memory device 621, an input device 623, and a display device 624.

The input device 623 is a device via which a control signal for controlling an operation of the AP 622 or data to be processed by the AP 622 is input, and may be embodied as a pointing device such as a touch pad and a computer mouse, a keypad, or a keyboard.

The AP 622 may display data stored in the memory device 621 on the display device 624 according to data inputted via the input device 623.

In one embodiment, the display device 624 may be embodied to include the display device 100 shown in FIG. 1.

Figure 15:
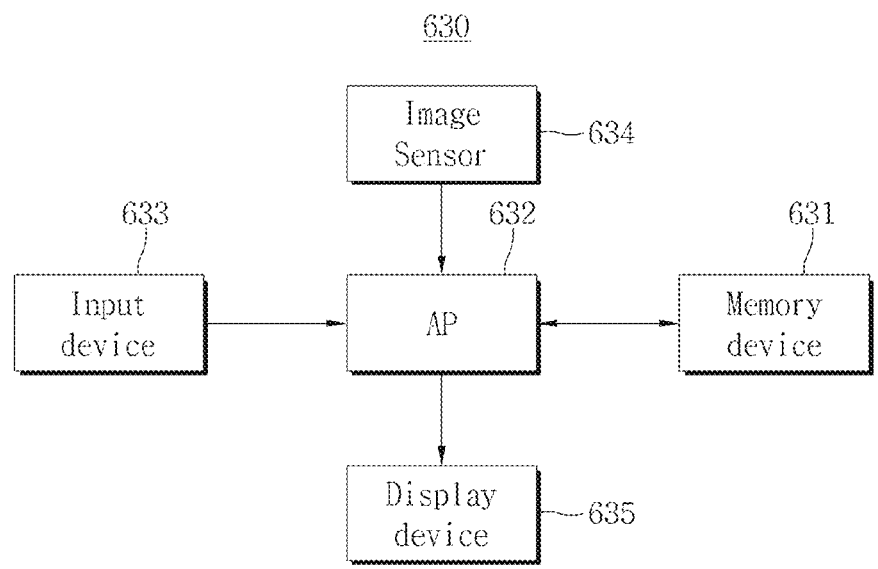
FIG. 15 is a block diagram illustrating a computer system according to still another example embodiment of the inventive concepts.

FIG. 15 is a block diagram illustrating a computer system according to still another example embodiment of the inventive concepts.

Referring to FIG. 15, the computer system 630 may be an image processing device, for example, a digital camera, or a mobile phone, a smart phone or a tablet PC on which the digital camera is installed.

The computer system 630 includes a memory device 631, an AP 632 including a memory controller for controlling a data processing operation of the memory device 631, for example, a write operation or a read operation, an input device 633, an image sensor 634, and a display device 635.

The image sensor 634 converts an optical image into digital signals, and the converted digital signals are transmitted to the AP 632. According to control of the AP 632, the converted digital signals are displayed through the display device 635 or stored in the memory device 631.

Further, the data stored in the memory device 631 is displayed through the display device 635 according to the control of the AP 632.

The input device 633 is a device via which a control signal for controlling an operation of the AP 632 or data to be processed by the AP 632 is input, and may be embodied as a pointing device such as a touch pad and a computer mouse, a keypad, or a keyboard.

In one embodiment, the display device 624 may be embodied to include the display device 100 shown in FIG. 1.

Figure 16:
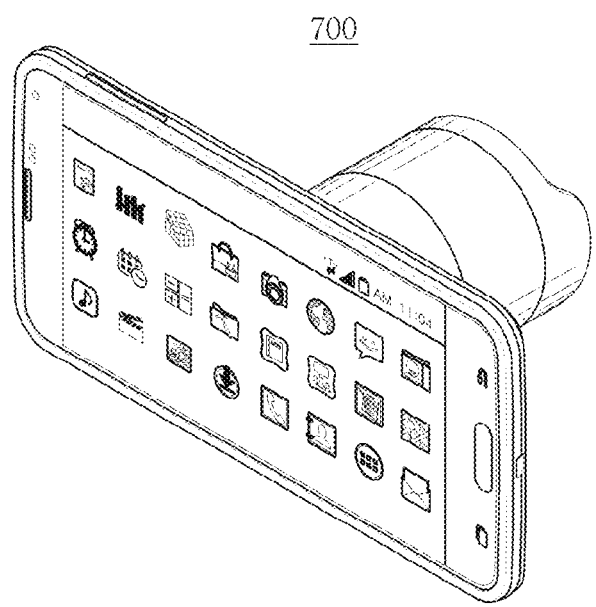
FIG. 16 illustrates an example of a digital camera device including the display device 100 shown in FIG. 1.

FIG. 16 illustrates a digital camera device including the display device 100 shown in FIG. 1.

Referring to FIG. 16, the digital camera device 700 operates with an Android™ OS. In an example embodiment, the digital camera device 700 may include a Galaxy Camera™ or Galaxy Camera2®.

The digital camera device 700 may include a touch panel 410 to receive a touch input from a user, a TSC to control the touch panel 410, an image sensor to capture an image or a moving image and an AP to control the image sensor.

In an example embodiment, the digital camera device 400 may include the display device 100 shown in FIG. 1.

Figure 17A:
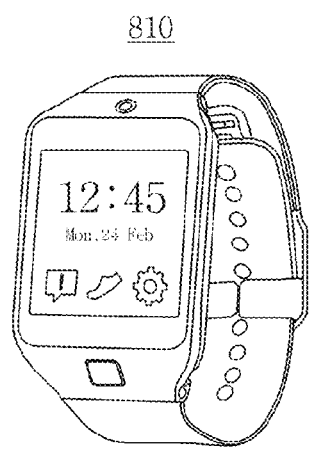
FIGS. 17A to 17C illustrate examples of wearable devices including the display device 100 shown in FIG. 1.
Figure 17B:
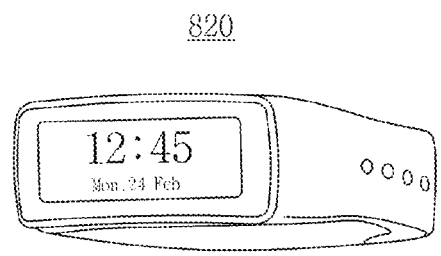
Figure 17C:
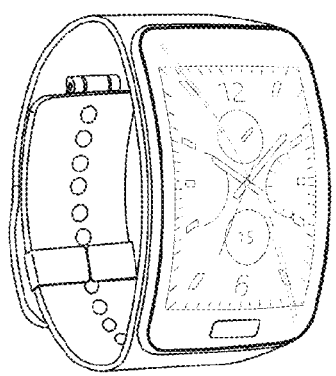

FIGS. 17A to 17C illustrate wearable devices including the display device 100 shown in FIG. 1.

Referring to FIGS. 17A and 17C, each of first to third wearable devices 810 to 830 has a type of a wrist watch. Each of the first to third wearable devices 810 to 830 operates with an Android™ OS or TIZEN™ OS.

In an example embodiment, the first wearable device 810 may include a Galaxy Gear2™. The second wearable device 820 may include a Galaxy Gear Fit™. The third wearable device 830 may include a Galaxy Gear S.

Each of the first to third wearable devices 810 to 830 may include an AP which operates with an Android™ operating system (OS) or TIZEN™ OS, an image sensor which captures an image or a moving picture and a display device which displays the photographed image or a moving picture.

In an example embodiment, each of the first to third wearable devices 810 to 830 may include the display device 100 shown in FIG. 1.

Figure 18:
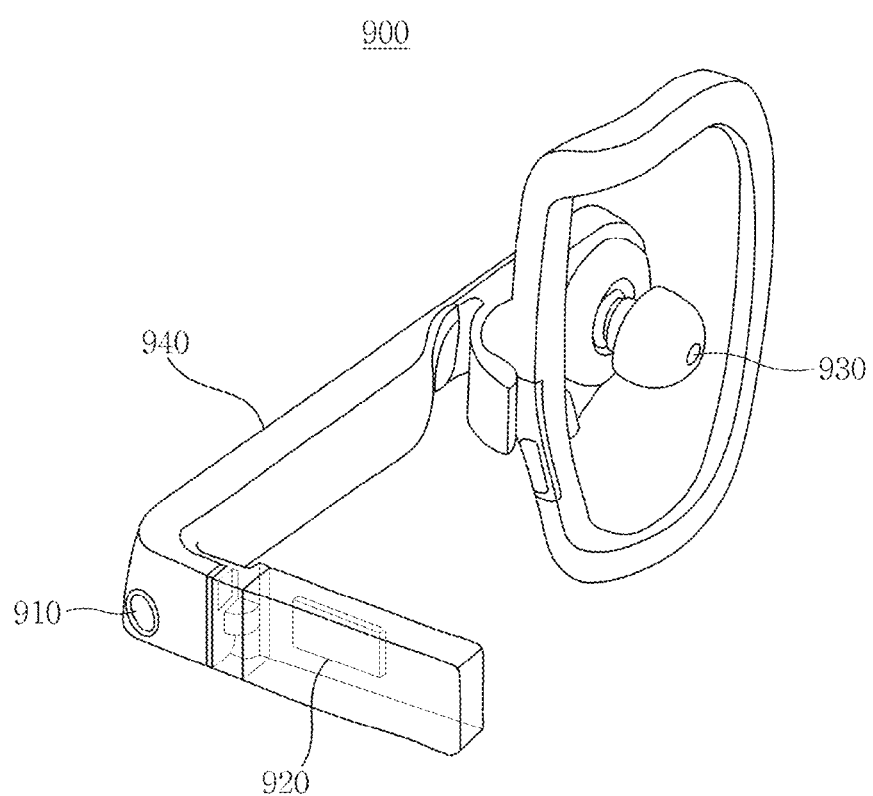
FIG. 18 illustrates a wearable device including the display device shown in FIG. 1.

FIG. 18 illustrates a wearable device including the display device shown in FIG. 1.

Referring to FIG. 18, the fourth wearable device 900 may be worn on an ear and provide sound and image information to a user. The fourth wearable device 900 operates with an Android™ OS or TIZEN™ OS. In an example embodiment, the fourth wearable device 900 may include a Galaxy Gear Blink™.

The fourth wearable device 900 may include an image sensor 910 which captures an image and a moving picture, a display device 920 which displays the photographed image, an earphone 930 for hearing sound, and an AP (not shown) for controlling the fourth wearable device 900.

In an example embodiment, the fourth wearable device 900 may include the display device 100 shown in FIG. 1.

An example embodiment of the inventive concepts may be applied to a display device including a DDI capable of testing itself.

The display device according to an example embodiment of the inventive concepts may test an internal logic by itself.

Moreover, the display device according to an example embodiment of the inventive concepts may reduce fault coverage.

The inventive concepts may be applied to an image processing device that contains an application processor. Further, the inventive concepts may be applied to mobile devices, such as smartphones, laptops, or tablets, or to wearable devices that include an application processor.

While the inventive concepts has been described with reference to example embodiments, it will be understood by those skilled in the art that various changes and modifications may be made without departing from the spirit and scope of the present invention as defined by the appended claims.

Although a few embodiments have been described, those skilled in the art will readily appreciate that many modifications are possible without materially departing from the novel teachings and advantages. Accordingly, all such modifications are intended to be included within the scope of the inventive concepts as defined in the claims.

What is claimed is:

1. A display driver integrated circuit (DDI), comprising:
a logic circuit configured to receive image data from a host, the logic circuit including a plurality of intellectual property blocks (IPs), each of the plurality of IPs configured to process the image data; and
an image cyclic redundancy check (CRC) unit configured to,
receive image data output from each of the IP blocks, select one of the output image data, and
perform CRC operations on the selected output image data, the CRC operations including comparing expected output data with the selected output image data, and
transmit results of the performed CRC operations to the host.

2. The DDI of claim 1, further comprising:
a reference pattern generator configured to,
generate reference pattern data and expected output data to verify the plurality of IP blocks of the logic circuit, and
transmit the reference pattern data to the logic circuit.

3. The DDI of claim 2, further comprising:
a selection circuit configured to transmit at least one of the image data and the reference pattern data to the logic circuit,
wherein the selection circuit is configured to transmit the image data to the logic circuit in a normal mode, and
the selection circuit is configured to transmit the reference pattern data to the logic circuit in a test mode.

4. The DDI of claim 2, wherein the reference pattern generator is configured to generate at least one of:
an all-black pattern, an all-white pattern, a 1×1 check pattern, a 2×2 check pattern, a 4×4 check pattern, a 8×8 check pattern, a column rainbow pattern, a page rainbow pattern, a 0~255 gray page pattern, a 0~239 grey column pattern, a 20% black & 80% white pattern, a 1(line)×1(line) pattern, a 2(line)×2(line) pattern, a crosstalk A pattern, a crosstalk B pattern, a crosstalk C pattern, or a flicker pattern.

5. The DDI of claim 1, wherein
the image CRC unit is configured to transmit to the host a log file based on information associated with at least one failed IP from the plurality of IPs.

6. The DDI of claim 1, further comprising:
a memory device configured to store the image data, wherein the memory device includes a graphic random access memory.

7. The DDI of claim 3, wherein
the logic circuit includes a decoder configured to decode the image data;
the decoder is configured to receive at least one of the image data or the reference pattern data; and
the image CRC unit is configured to compare the expected output data with image data output by the decoder.

8. The DDI of claim 7, wherein
the host is configured to transmit encoded image data to the logic circuit; and
the decoder is configured to decode the encoded image data and transmit the decoded image data to a source driver.

9. A timing controller, comprising:
a logic circuit configured to receive image data from a host, the logic circuit including a plurality of intellectual property blocks (IPs) each configured to process the image data; and
an image cyclic redundancy check (CRC) unit configured to,
receive image data output from each of the IP blocks, select one of the output image data, and
perform a CRC operation on the selected output image data, and
transmit the performed result to the host,
wherein the performing the CRC operations includes comparing expected output data with the selected output image data.

10. The timing controller of claim 9, further comprising:
a reference pattern generator configured to generate reference pattern data and expected output data for the verification of the logic circuit,
wherein the reference pattern generator is configured to transmit the reference pattern data to the logic circuit.

11. The timing controller of claim 10, further comprising:
a selection circuit configured to transmit at least one of the image data and the reference pattern data to the logic circuit,
wherein the selection circuit is configured to transmit the image data to the logic circuit in a normal mode, and
the selection circuit is configured to transmit the reference pattern data to the logic circuit in a test mode.

12. The timing controller of claim 10, wherein the reference pattern generator is configured to generate at least one of:
an all-black pattern, an all-white pattern, a 1×1 check pattern, a 2×2 check pattern, a 4×4 check pattern, a 8×8 check pattern, a column rainbow pattern, a page rainbow pattern, a 0~255 gray page pattern, a 0~239 grey column pattern, a 20% black & 80% white pattern, a 1(line)×1(line) pattern, a 2(line)×2(line) pattern, a crosstalk A pattern, a crosstalk B pattern, a crosstalk C pattern, or a flicker pattern.

13. The timing controller of claim 9, wherein
the image CRC unit is configured to transmit a log file to the host based on information associated with at least one failed IP from the plurality of IPs.

14. The timing controller of claim 9, further comprising:
a memory device configured to store the image data, wherein the memory device includes a graphic random access memory.

15. The timing controller of claim 12, wherein the logic circuit includes,
a decoder configured to decode the image data, and the decoder configured to receive at least one of the image data and the reference pattern data; and
the image CRC unit is configured to compare the expected output data with output from the decoder.

16. A system for testing internal logic circuits within a semiconductor device, comprising:
a host configured to transmit source data to be sent to an output device; and
an internal logic circuit configured to process the transmitted source data, the logic circuit including,
a plurality of intellectual property blocks (IPs) configured to process the transmitted source data; and
a data error check unit configured to,
receive data output from each of the IP blocks,
select one of the output data, and
perform a data error check operation corresponding to reference data and the selected output data, the data error check operation including comparing expected output data with the selected output data.

17. The system of claim 16, wherein the logic circuit includes,
a test pattern generator configured to generate a test data; and
a selection unit configured to transmit the reference data to the data error check unit, wherein the reference data is associated with the test data or the transmitted source data.

18. The system of claim 16, wherein
the data error check unit is configured to output results of the data error check operation to the host; and
the host is configured to verify the operation of the internal logic circuit.

19. The system of claim 16, wherein
the internal logic circuit is associated with a timing controller.

20. The system of claim 16, wherein,
the output device is a display panel configured to receive and display the processed data from the internal logic circuit, and
the internal logic circuit is associated with a display driver integrated circuit.

* * * * *